(12) United States Patent
Kawasaki et al.

(10) Patent No.: US 7,164,175 B2
(45) Date of Patent: Jan. 16, 2007

(54) SEMICONDUCTOR DEVICE WITH SILICON-FILM FINS AND METHOD OF MANUFACTURING THE SAME

(75) Inventors: Hirohisa Kawasaki, Yokohama (JP); Kazunari Ishimaru, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 139 days.

(21) Appl. No.: 10/835,122

(22) Filed: Apr. 28, 2004

(65) Prior Publication Data
US 2005/0026377 A1 Feb. 3, 2005

(30) Foreign Application Priority Data
Jul. 31, 2003 (JP) ............................ 2003-204386
Apr. 5, 2004 (JP) ............................ 2004-111095

(51) Int. Cl.
*H01L 29/76* (2006.01)
(52) U.S. Cl. ...................... 257/401; 257/379
(58) Field of Classification Search ............... 257/379, 257/401
See application file for complete search history.

(56) References Cited
U.S. PATENT DOCUMENTS
5,225,701 A 7/1993 Shimizu et al.
5,554,870 A 9/1996 Fitch et al.
6,762,448 B1 * 7/2004 Lin et al. .................... 257/302

FOREIGN PATENT DOCUMENTS
JP 4-250667 9/1992
JP 5-283700 10/1993
JP 11-330462 11/1999

OTHER PUBLICATIONS

E.J. Nowak et al., "*A Functional FinFET-DGCMOS SRAM Cell*," International Electron Device Meeting, 2002, pp. 411-414.

* cited by examiner

*Primary Examiner*—Douglas M. Menz
(74) *Attorney, Agent, or Firm*—Frommer Lawrence & Haug LLP

(57) ABSTRACT

A semiconductor device includes a semiconductor substrate, an insulating film projected on a surface of the semiconductor substrate, a semiconductor film provided on a side surface of the insulating film, and MIS transistor formed in the semiconductor film, the MIS transistor having source, gate and drain region. The semiconductor device further includes a gate electrode provided on the gate region of the MIS transistor, the length of the gate electrode being larger than the thickness of the semiconductor film.

11 Claims, 33 Drawing Sheets

SEMICONDUCTOR DEVICE WITH SILICON-FILM FINS AND METHOD OF MANUFACTURING THE SAME

CROSS-REFERENCE TO RELATED APPLICATIONS

This application is based upon and claims the benefit of priority from prior Japanese Patent Applications No. 2003-204386, filed Jul. 31, 2003; and No. 2004-111095, filed Apr. 5, 2004, the entire contents of both of which are incorporated herein by reference.

BACKGROUND OF THE INVENTION

1. Field of the Invention

This invention relates to a semiconductor device with silicon-film fins and a method of manufacturing the same. More particularly, this invention relates to a MOS (Metal Oxide Semiconductor) transistor with a three-dimensional structure.

2. Description of the Related Art

In recent years, several configurations of a MOS transistor with a three-dimensional structure and several methods of manufacturing such a MOS transistor have been proposed (for example, see E. J. Nowak, et al., "A Functional FinFET-DGCMOS SRAM Cell," International Electron Device Meeting 2002, pp. 411–414). A MOS transistor with a three-dimensional structure has silicon-film fins functioning as a source and a drain. In the MOS transistors with a three-dimensional structure, it is essential to make the width (thickness) of a fin narrower (thinner) than a gate length because of the requirements of transistor characteristics, including to suppress short channel effects.

However, in a MOS transistor with a three-dimensional structure, a fin whose width is narrower than the gate length is difficult to form in such a manner that the fin is prevented from lying down and variance in its garget dimensions are suppressed. In addition to enhance the current driving capability of the transistor, it is necessary to make the fin higher. However, it is very difficult to form a narrow fin with a high aspect ratio in a LSI (Large Scale Integrated circuit).

Furthermore, to form a MOS transistor with a three-dimensional structure, it is necessary to form a stopper layer and a cap layer on the top of the fins in such a process as a CMP (Chemical Mechanical Polishing) process or an RIE (Reactive Ion Etching) process. Since the fins are narrow, the width of the stopper layer and that of the cap layer are also narrow, which decreases process endurance.

Moreover, the width of the gate electrode is also narrow at the top of the narrow fin. Thus, on the top of the fin, the gate electrode cannot directly be contacted with the metal plug which is connected to the first metal layer. Accordingly, the gate electrode needs to be led to a substrate surface and contacted with the metal plug there, leading to a loss in area. Particularly in forming a gate electrode which covers the Si-Fin whose aspect ration is very high, a considerable amount of overetching is required to remove completely the gate polysilicon deposited on the non-gate region. In the overetching, there is a possibility that an undesirable substrate etching will take place or that, if all of the cap layer on the top of the fin has been etched, the fin will be etched as well.

In addition, in a sidewall insulating film (sidewall) formation, it needs to prevent from any interferences to a silicidation of the source and drain. Therefore, the insulating film serving as a sidewall has to be removed completely from the side surface of the fins serving as the source and drain. In this case, a considerable amount of overetching is also required as in the formation of the gate electrode. If the insulating film is left on the side surfaces of the fins, this causes a problem: the silicidation of the source and the drain is non-uniform.

BRIEF SUMMARY OF THE INVENTION

According to a first aspect of the present invention, there is provided a semiconductor device comprising: a semiconductor substrate; an insulating film projected on a surface of the semiconductor substrate; a semiconductor film provided on a side surface of the insulating film; MIS transistor formed in the semiconductor film, the MIS transistor having source, gate and drain region; and a gate electrode provided on the gate region of the MIS transistor, the length of the gate electrode being larger than the thickness of the semiconductor film.

According to a second aspect of the present invention, there is provided a semiconductor device comprising: a semiconductor substrate; an insulating film projected on a surface of the semiconductor substrate; first and second semiconductor films provided on first and second side surfaces of the insulating film, respectively; first and second MIS transistors formed in the first and second semiconductor films respectively, the MIS transistors each having source, gate and drain region; and a gate electrode provided on the gate regions of the first and the second MIS transistors and on a top surface of the insulating film, the length of the gate electrode being larger than the thickness of each of the first and second semiconductor films.

According to a third aspect of the present invention, there is provided a semiconductor device comprising: a semiconductor substrate; a plurality of insulating films provided on a surface of the semiconductor substrate so as to be perpendicular to the surface; a first and second semiconductor films each having a thickness thinner than a gate length and provided on a first and second side surface of each of the plurality of insulating films; a plurality of gate electrodes each provided so as to interpose the corresponding first and second semiconductor films and the corresponding insulating films in between from upper side; a first wiring which selectively connects the plurality of gate electrodes with one another; a second wiring which selectively connects the plurality of gate electrodes with the first and second semiconductor films and the first and second semiconductor films with one another; and a plurality of wiring contacts which are selectively connected to the plurality of gate electrodes and the first and second semiconductor films.

According to a fourth aspect of the present invention, there is provided a semiconductor device manufacturing method comprising: depositing a first insulating film on a semiconductor film formed on a semiconductor substrate; forming an opening by selectively etching the first insulating film and the semiconductor film; forming a dimple by selectively etching the first insulating film; forming a T-shaped insulating film by filling the opening and the dimple with a second insulating film; forming a first and second semiconductor films having a thickness thinner than a gate length on a first and second side surfaces of the insulating film by etching the semiconductor film with the insulating film as a mask after removing all of the first insulating film; and forming a gate electrode so as to interpose the insulating film and the first and second semiconductor films in between from upper side.

According to a fifth aspect of the present invention, there is provided a semiconductor device manufacturing method comprising: selectively forming a first and second well regions on a semiconductor substrate; embedding insulating films with a T-shaped cross section in the surfaces of the first and second well regions; forming a first and second semiconductor films having a thickness thinner narrower than a gate length on a first and second side surface of the insulating film by etching part of the first and second well regions with the insulating film as a mask; and forming a gate electrode so as to interpose the insulating film and the first and second semiconductor films in between from upper side.

According to a sixth aspect of the present invention, there is provided a semiconductor device manufacturing method comprising: depositing a seventh insulating film on a semiconductor substrate; forming an opening by selectively etching the seventh insulating film; forming a first insulating film by filling the opening with an eighth insulating film; forming a predetermined spacing among the seventh insulating film and a first and second side surface of the first insulating film by selectively etching the seventh insulating film; forming a first and second semiconductor films by epitaxial growth on a first and second side surface of the first insulating film corresponding to the spacing; forming a second insulating film by filling the first and second side surfaces of the first insulating film corresponding to the spacings on the tops of the first and second semiconductor films with a ninth insulating film; removing the seventh insulating film by selectively etching; and forming a gate electrode so as to interpose the first and second insulating films and the first and second semiconductor films in between from upper side.

DETAILED DESCRIPTION OF THE INVENTION

Hereinafter, referring to the accompanying drawings, embodiments of the present invention will be explained.

First Embodiment

Figure 1:
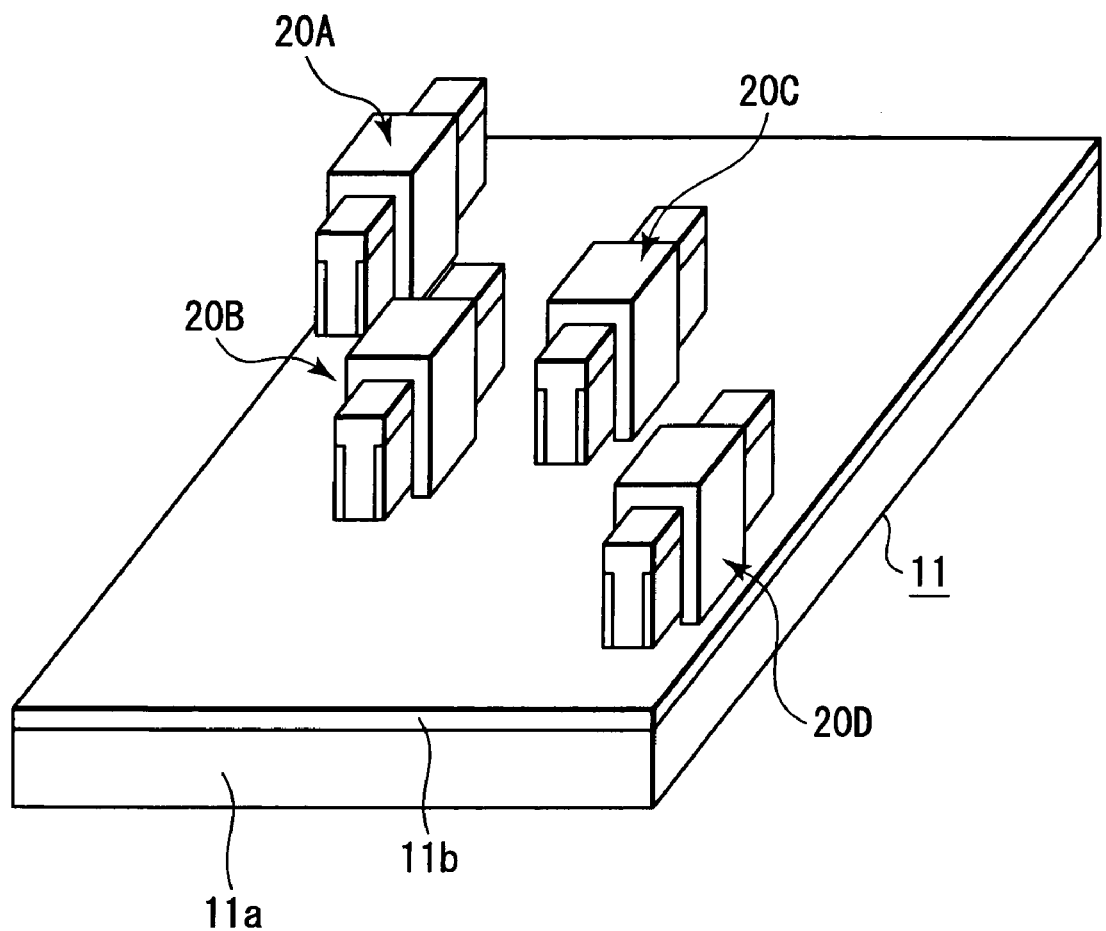
FIG. 1 is a perspective view of the basic configuration of a MOS transistor with a three-dimensional structure according to a first embodiment of the present invention.
Figure 2A:
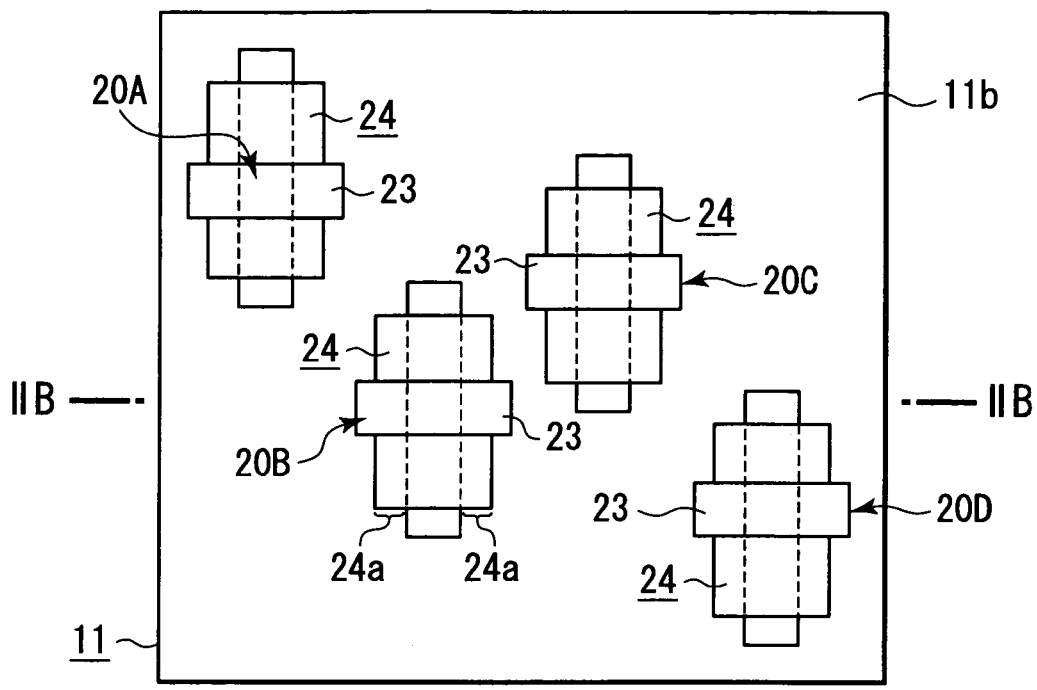
FIG. 2A is a plan view of the MOS transistor shown in FIG. 1.
Figure 2B:
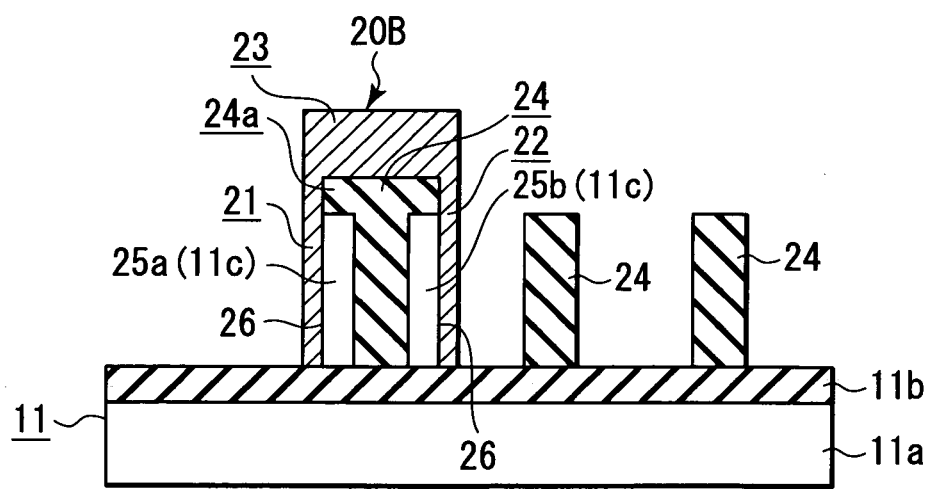
FIG. 2B is a sectional view taken along line IIB—IIB of FIG. 2A.
Figure 3A:
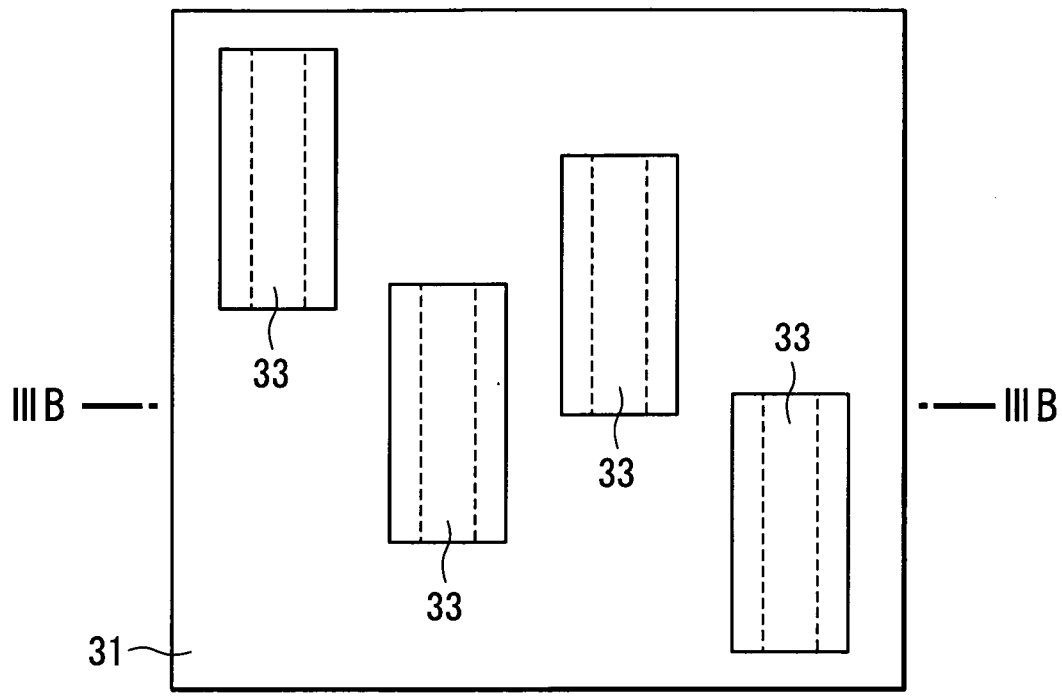
FIGS. 3A and 3B are diagrams to help explaining a method of forming Projections in the MOS transistor of FIG. 1.
Figure 3B:
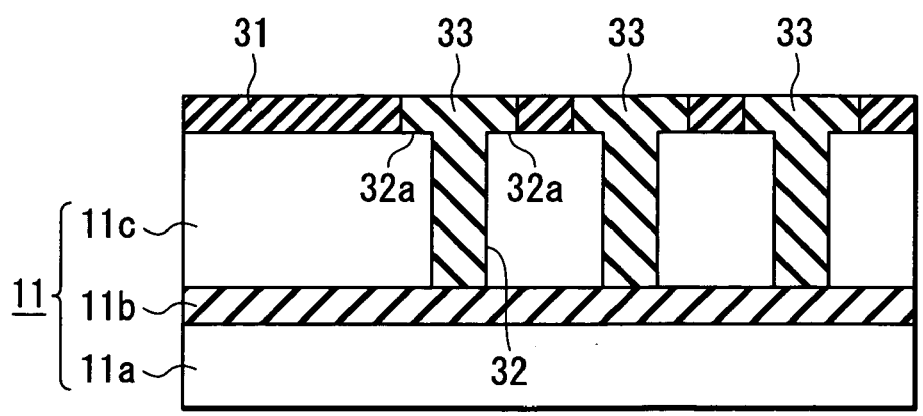
Figure 4A:
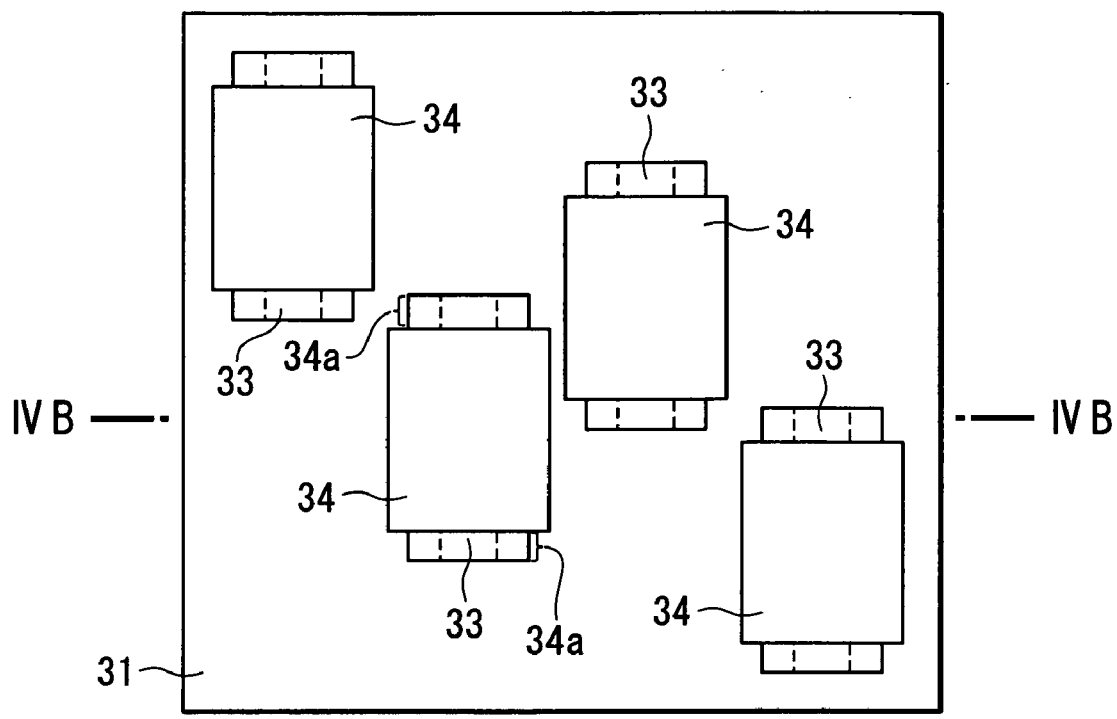
FIGS. 4A and 4B are diagrams to help explaining a method of forming Projections in the MOS transistor of FIG. 1.
Figure 4B:
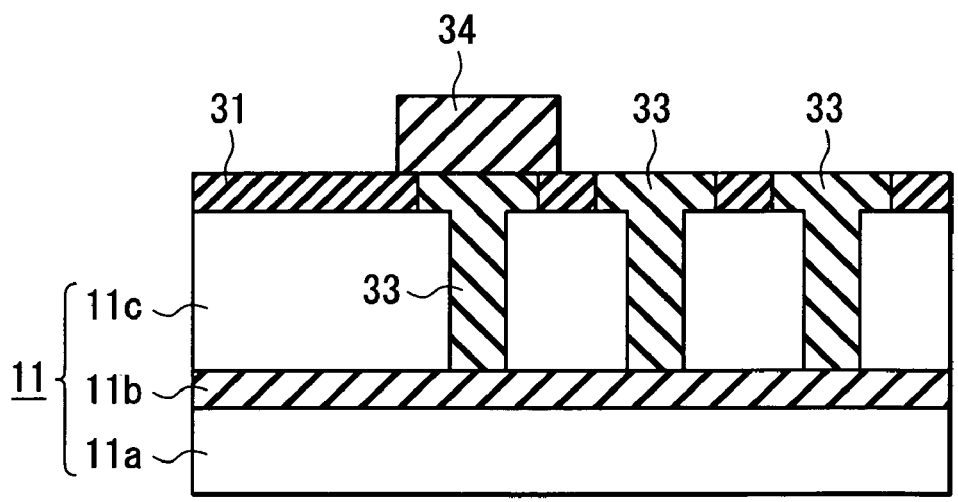
Figure 5A:
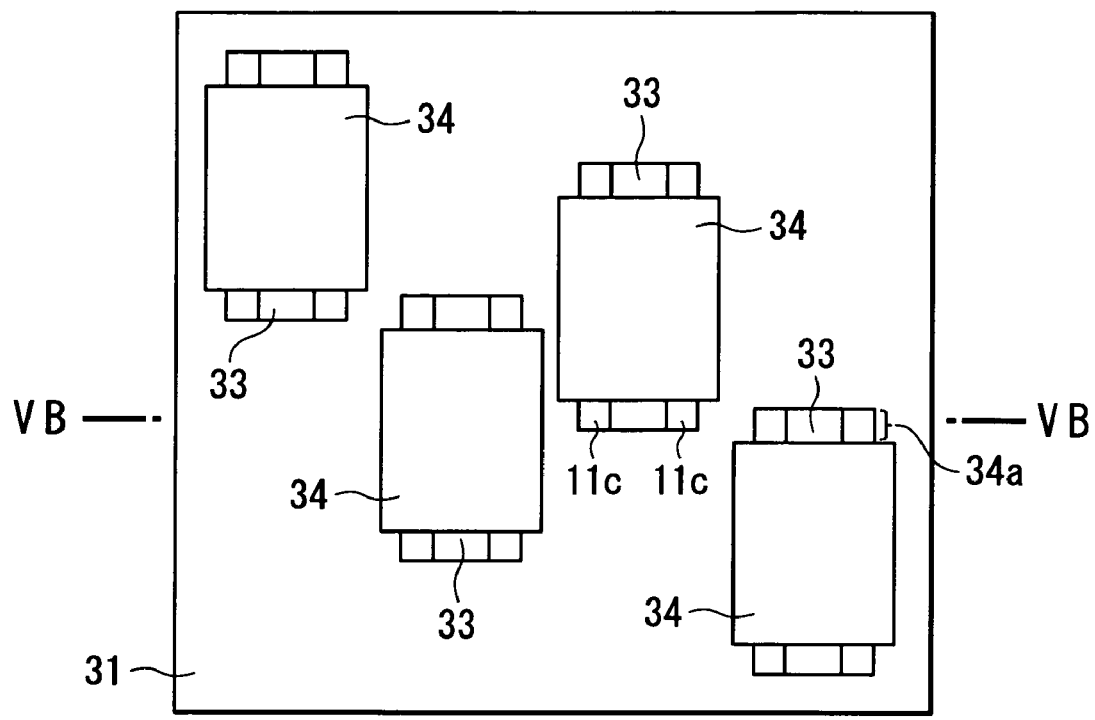
FIGS. 5A and 5B are diagrams to help explaining a method of forming Projections in the MOS transistor of FIG. 1.
Figure 5B:
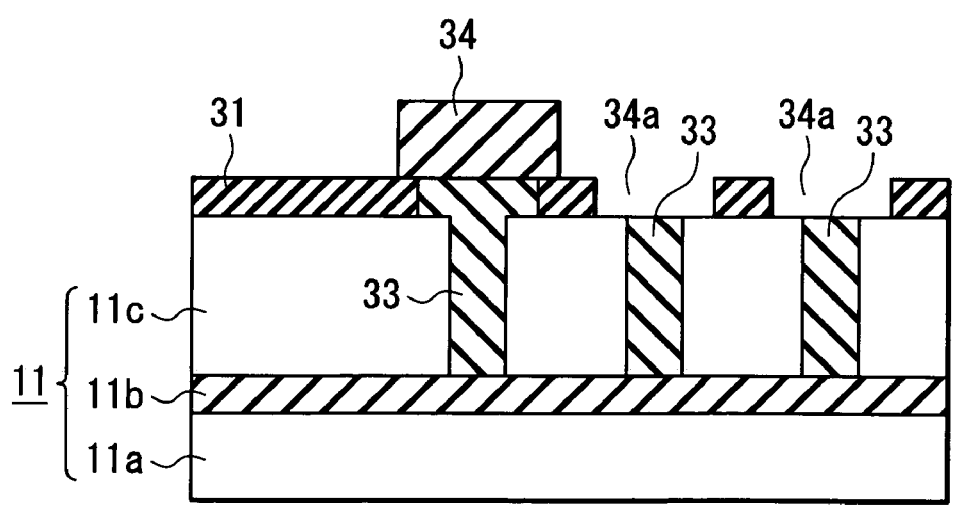
Figure 6A:
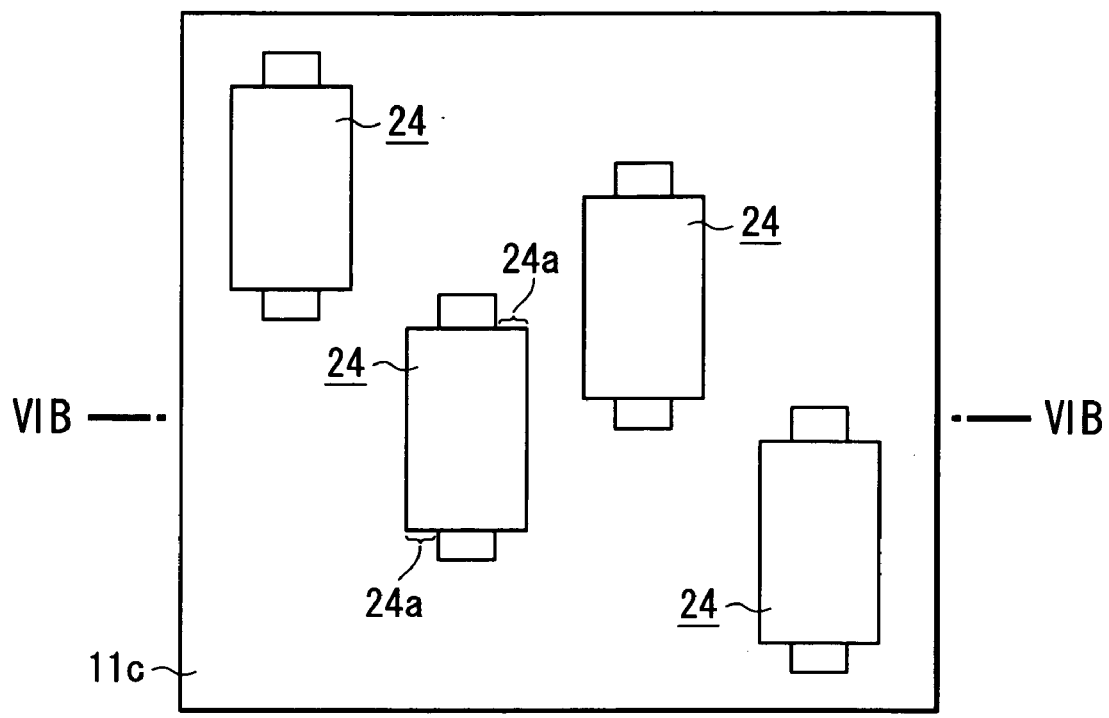
FIGS. 6A and 6B are diagrams to help explaining a method of forming Projections in the MOS transistor of FIG. 1.
Figure 6B:
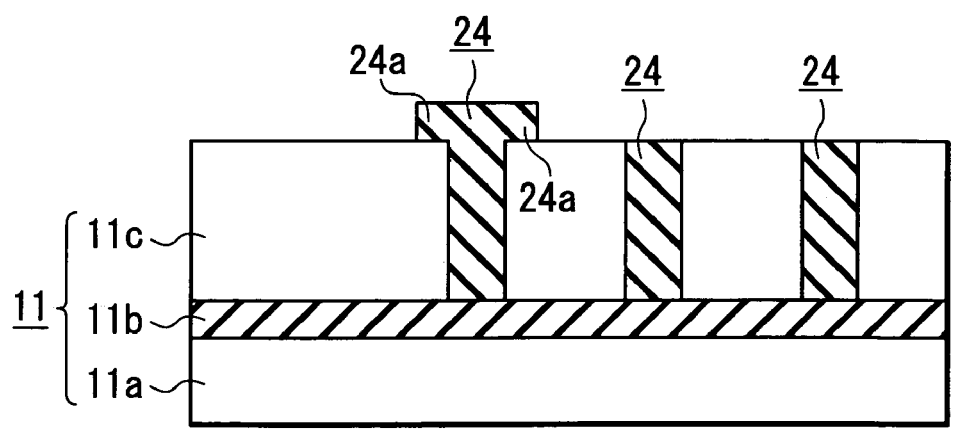
Figure 7A:
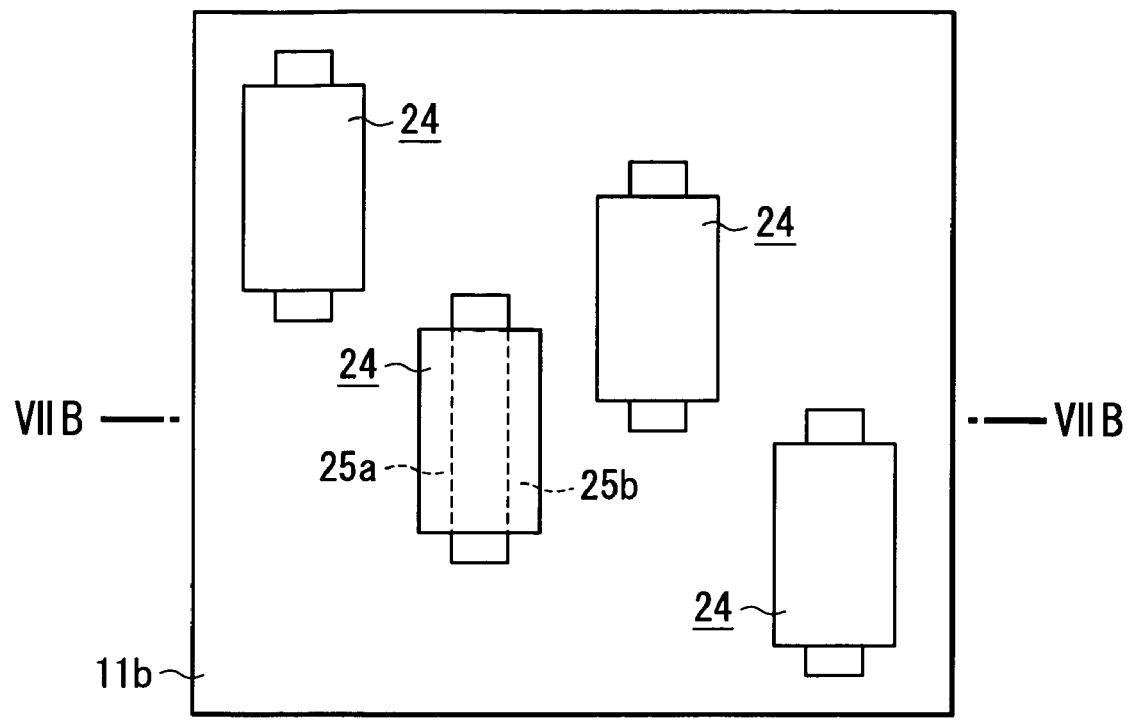
FIGS. 7A and 7B are diagrams to help explaining a method of forming Projections in the MOS transistor of FIG. 1.
Figure 7B:
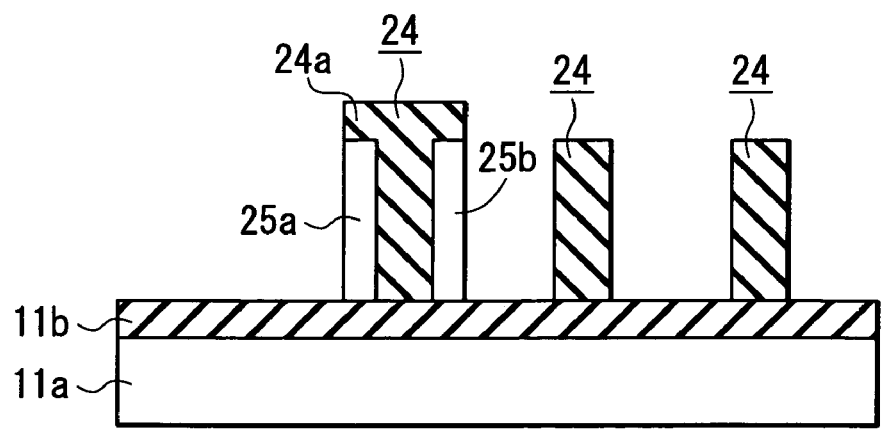

FIG. 1 and FIGS. 2A and 2B show a configuration of a MOS transistor with a three-dimensional structure according to a first embodiment of the present invention. In the first embodiment, a case where an SRAM cell constructed with six transistors will be explained. FIG. 1 is a perspective view of the MOS transistor. FIG. 2A is a plan view of the MOS transistor. FIG. 2B is a sectional view taken along line IIB—IIB of FIG. 2A.

In the first embodiment, for example, as shown in FIG. 1 and FIG. 2A, four Projections 20A, 20B, 20C, 20D are provided on an SOI (Silicon on Insulator) substrate 11. Each of the four Projections 20A, 20B, 20C, 20D has a structure where two transistors (n-type MOS transistors or p-type MOS transistors) 21, 22 share a single gate electrode 23 as shown in FIG. 2B.

Specifically, on a silicon (Si) substrate 11a of the SOI substrate 11, four insulating films 24 are provided on a buried oxide film (BOX) layer 11b. Each of the insulating films 24 is provided in such a manner that it stands up on the surface of the BOX layer 11b almost in the vertical direction. The insulating films 24 each has an almost T-shaped cross section and a pair of rectangular side surfaces. On a pair of side surfaces of each insulating film 24, that is, on both side surfaces of each insulating film 24, n-type or p-type silicon-film Fins (Si-fins) 25a, 25b, serving as a first and a second semiconductor film, are provided. The Si-fins 25a, 25b are formed so as to have almost the same film thickness (width) as that of the projected section 24a of each insulating film 24. Then, a gate electrode 23 is provided in such a manner that it interposes, from upper side, a projecting part composed of the Si-fins 25a, 25b and the insulating film 24 in between. A gate dielectric film 26 is formed among the gate electrode 23 and the Si-fin 25a, 25b. As a result, each of the four Projections 20A, 20B, 20C, 20D is configured to have a structure in which two transistors 21, 22 share a single gate electrode 23. In the transistors 21 and 22, a gate region is formed in that portion of each of the Si-fins 25a and 25b which corresponds to the gate electrode 23. Source and drain regions are formed on both sides of the gate region.

With this configuration, the direction of current flowing in each channel (the transistors 21, 22) is almost parallel to the surface of the SOI substrate 11 in each of the four Projections 20A, 20B, 20C, 20D. The SOI substrate 11 is configured to have Si layers 11c serving as the Si-fins 25a, 25b above the Si substrate 11a interposing the BOX layer 11b.

Here, a method of forming the Projections 20A, 20B, 20C, 20D will be explained by reference to FIGS. 3A and 3B to FIGS. 7A and 7B. First, on a SOI substrate 11, a first insulating film, for example, a silicon nitride (SiN) film 31 is deposited. By a lithography process and an RIE process, the SiN film 31 and Si layer 11c corresponding to areas where insulating films 24 to be formed are etched. The Si layer 11c is etched until the BOX film 11b is exposed. As a result, a trench (opening) 32 with a rectangular shape on the surface is formed in the Si layer 11. Then, the remaining SiN film 31 is wet-etched with, for example, phosphoric acid, thereby pulling back the SiN film as much width as corresponds to the predetermined widths of the Si-fins 25a, 25b to be formed. Then, the inside of the trench 32 formed in the Si layer 11c and the inside of the pullback area 32a formed by the retraction of the SiN film 31 are filled with a second insulating layer, for example, TEOS (Tetra Ethoxy Silane) film 33 (see FIGS. 3A and 3B).

Next, the TEOS film 33 is masked with a resist 34. At this time, a non-mask region 34a having a length longer than the width of the pullback area 32a (the widths of the Si-fins 25a, 25b) is formed on both ends of the TEOS film 33 in the longitudinal direction (see FIGS. 4A and 4B). Next, with the resist 34 as a mask, the TEOS film 33 in the non-mask region 34a is etched by a thickness equivalent to the thickness of the SiN film 31 (see FIGS. 5A and 5B). After the resist 34 is removed, then, the SiN film 31 is etched with phosphoric acid, thereby removing all of the SiN films remained (see FIGS. 6A and 6B). Then, with each insulating film 24 as a mask, the Si layer 11c is etched, thereby exposing the BOX layer 11b under the Si layer 11c. In this way, the thin Si-fins 25a, 25b each having a width corresponding to the width of the projected section 24a and composed of the Si layer 11c are formed on both side surfaces of each insulating layer 24 (see FIGS. 7A and 7B).

As described above, with the insulating film 24 having a T-shaped cross section as a mask, the Si layer 11c is processed by RIE, thereby leaving a thin Si layer 11c only on the first and second side surfaces of the insulating film 24. That is, in the above-described method, the very thin Si-fins 25a, 25b whose thickness is equivalent to a corresponding width of the projected section 24a (for example, several tens of angstroms) can be formed on a pair of side surfaces of the insulating film 24.

Then, after a gate dielectric film 26 is formed on each of the side surfaces of the Si-fins 25a, 25b by an oxidation and others, a gate electrode material, such as polysilicon, is deposited on the entire surface. Then, the polysilicon is etched by a lithography process and an RIE process, thereby forming a desired gate electrode 23. In this way, each of the MOS transistors (Projections 20A, 20B, 20C, 20D) having the structure shown in FIG. 1 and FIGS. 2A and 2B is completed.

In each of the Projections 20A, 20B, 20C, 20D, each of the Si-fins 25a, 25b is doped to have a desired conductivity type (n-type or p-type) by ion implantation (I/I) to the area where the gate electrode 23 is not formed. With this structure, the two transistors 21, 22 sharing a single gate electrode 23 function as independent MOS transistors. That is, in each of the Projections 20A, 20B, 20C, 20D, both of the two transistors 21, 22 are of the n-type or p-type MOS transistors, or one of the two is of the n-type MOS transistor and the other is the p-type MOS transistor.

As described above, an Si-fin whose width is thinner than the gate length can be formed. Specifically, it is possible to form an Si-fin whose thickness is thinner than a critical dimension of the lithography process in a lateral direction to the SOI substrate, for example, of the order of about several tens angstroms. As a result, it is possible to form a MOS transistor with a full-depletion-type three-dimensional structure whose short channel effect is suppressed. In addition, with this configuration, since the width of the Si-fin can be controlled easily, variance in the dimensions of the Si-fin can be decreased, which enables to manufacture a large number of projections whose transistor characteristics are uniform.

Furthermore, according to the first embodiment, a Si-fin whose width is thinner than the gate length is formed on a pair of side surfaces of the insulating film having, for example, several tens of nanometers in thickness almost perpendicular to the SOI substrate. Accordingly, even when the Si-fin has the width thinner than the gate length, the Si-fin is resistant to lie down and is easy to make it higher.

The transistor is preferred when an improved current driving capability of the transistor is required.

Since the cap layer and stopper layer can be made wider in such a process as an RIE process or a CMP process, process endurance can be improved. Furthermore, the gate electrode may directly be contacted with the metal plug the top surface of the projecting part without being led the gate electrode onto the substrate surface, which is preferable for reducing the area.

A damascene-structured gate electrode may be used as the gate electrode 23. In addition, the gate dielectric film 26 may be formed by CVD (Chemical Vapour Deposition) techniques or sputtering techniques.

Second Embodiment

Figure 8:
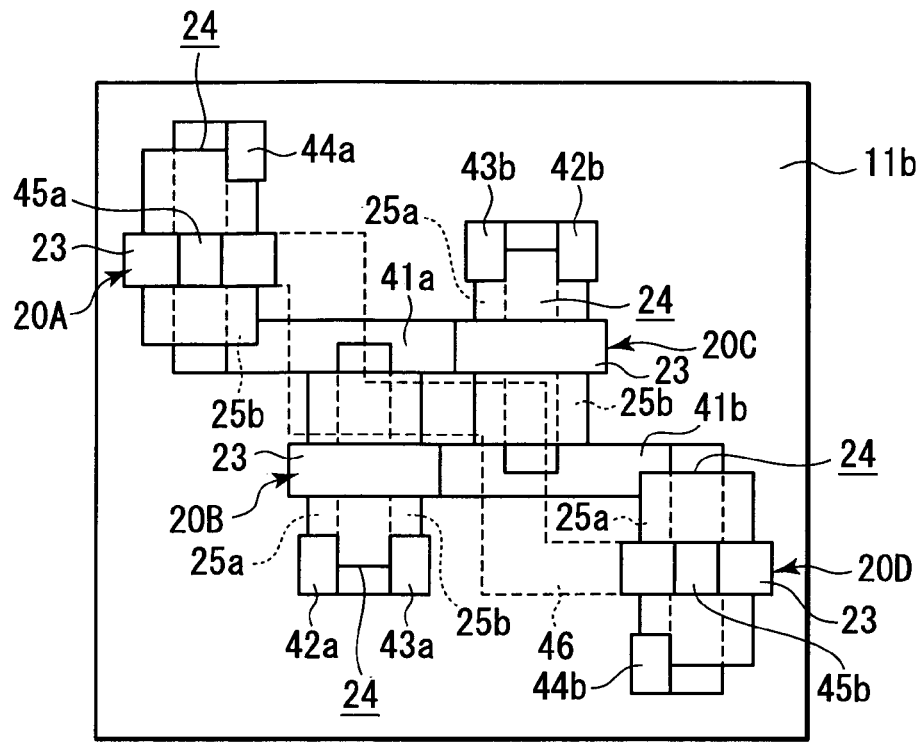
FIG. 8 is a plan view showing a configuration of an SRAM (Static Random Access Memory) cell with a 6-transistor structure composed of four Projections according to a second embodiment of the present invention.

FIG. 8 shows an SRAM cell composed of six transistors according to a second embodiment of the present invention. Explanation will be given about a case where one SRAM cell includes four projections which are each made of a T-shaped insulating film and two semiconductor film as explained in the first embodiment.

When one SRAM cell is composed of four Projections 20A, 20B, 20C, 20D, the transistor 22 of the Projection 20A, the transistor 21 of the Projection 20B, the transistor 22 of the Projection 20C, and the transistor 21 of the Projection 20D are n-type MOS transistors. And the transistor 22 of the Projection 20B and the transistor 21 of the Projection 20C are p-type MOS transistors.

Specifically, in the second embodiment, four Projections 20A, 20B, 20C, 20D have at least a configuration described below. That is the Projection 20A has an n-type Si-fin 25b, the Projection 20B has an n-type Si-fin 25a and a p-type Si-fin 25b, the Projection 20C has a p-type Si-fin 25a and an n-type Si-fin 25b, and the Projection 20D has an n-type Si-fin 25a. When a plurality of SRAM cells are formed, the Si-fin 25a (transistor 21) of the Projection 20A and the Si-fin 25b (transistor 22) of the Projection 20D are both made the n type and used by adjacent SRAM cells.

And, for example, as shown in FIG. 8, one end of the n-type Si-fin 25a and one end of the p-type Si-fin 25b in the Projection 20B are connected with a metal wiring 41a serving as a second wiring layer. A Vss contact 42a is connected to the other end of the n-type Si-fin 25a. A Vdd contact 43a is connected to the other end of the p-type Si-fin 25b. As a result, a first inverter circuit composed of the two transistors 21, 22 in the Projection 20B is configured.

Similarly, one end of the p-type Si-fin 25a and one end of the n-type Si-fin 25b in the Projection 20C are connected with a metal wiring 41b serving as a second wiring layer. A Vdd contact 43b is connected to the other end of the p-type Si-fin 25a. A Vss contact 42b is connected to the other end of the n-type Si-fin 25b. As a result, a second inverter circuit composed of the two transistors 21, 22 in the Projection 20C is configured.

The metal wiring 41a is connected to the gate electrode 23 of the Projection 20C. The metal wiring 41b is connected to the gate electrode 23 of the Projection 20B. As a result, a latch circuit is configured which is composed of the two Projections 20B, 20C and is for memorizing the cell data.

Furthermore, the metal wiring 41a is connected to one end of the n-type Si-fin 25b of the Projection 20A. A bit line contact 44a is connected to the other end of the n-type Si-fin 25b interposing the gate electrode 23. Similarly, the metal wiring 41b is connected to one end of the n-type Si-fin 25a of the Projection 20D. A bit line contact 44b is connected to the other end of the n-type Si-fin 25a interposing the gate electrode 23.

And, word line contacts 45a, 45b are connected to the gate electrodes 23, 23 of the Projections 20A, 20D, respectively. The gate electrodes 23, 23 of the Projections 20A, 20D are connected to each other with an upper-level wiring 46, thereby configuring two transfer transistors.

As described above, a 6-transistor-structure SRAM cell including a single latch circuit and two transfer transistors can be manufactured from four Projections 20A, 20B, 20C, 20D. Since the SRAM cell enables to make a wider cap layer or stopper layer in such a process as an RIE process or a CMP process, the process endurance can be improved. Furthermore, since the metal plug (word line contacts 45a, 45b) can be directly contacted with the gate electrode on the top surface of the projecting part, this is preferable for reducing the cell area.

In addition, each of the contacts 42a, 42b, 43a, 43b, 44a, 44b can be brought into more reliably contacting with the horizontal surface and vertical surface of each of the Si-fins 25a, 25b.

Hereinafter, a method of manufacturing the above-described SRAM cell will be explained. Before the explanation, a method of forming a gate electrode and a method of forming a sidewall insulating film (sidewall) to the side of the gate electrode will be explained concretely. That is, in an actual SRAM cells manufacturing, sidewalls are formed accompanying to the formation of gate electrodes.

Figure 10A:
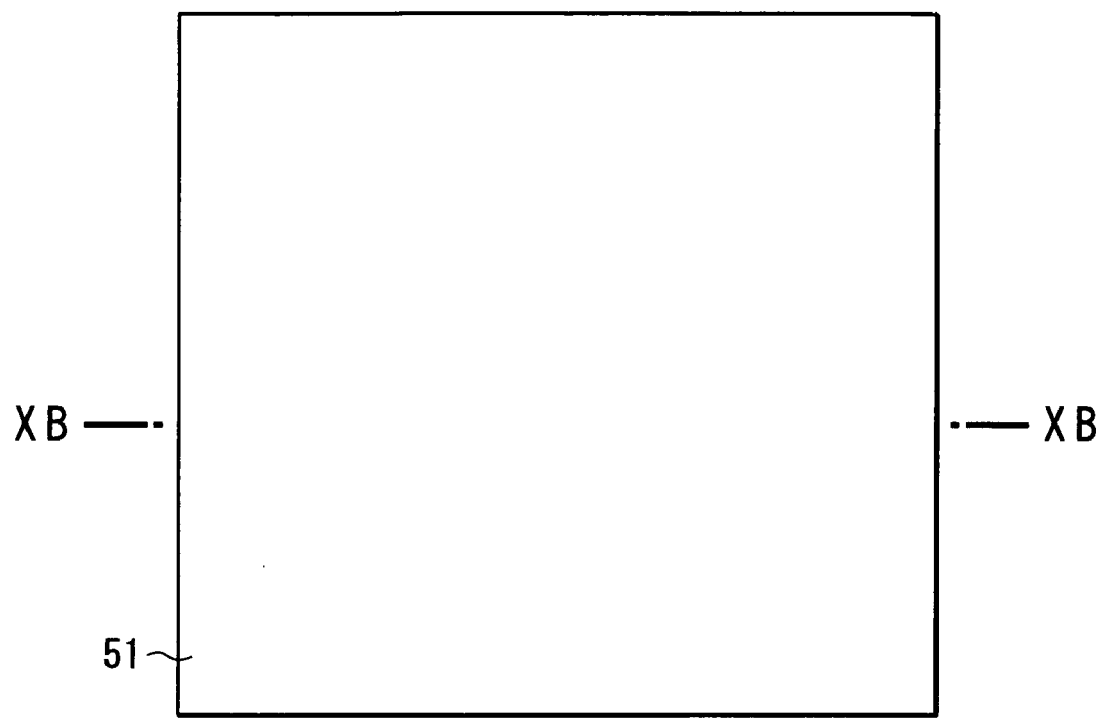
FIGS. 10A and 10B are diagrams to help explaining a method of forming a gate electrode in a Projection.
Figure 10B:
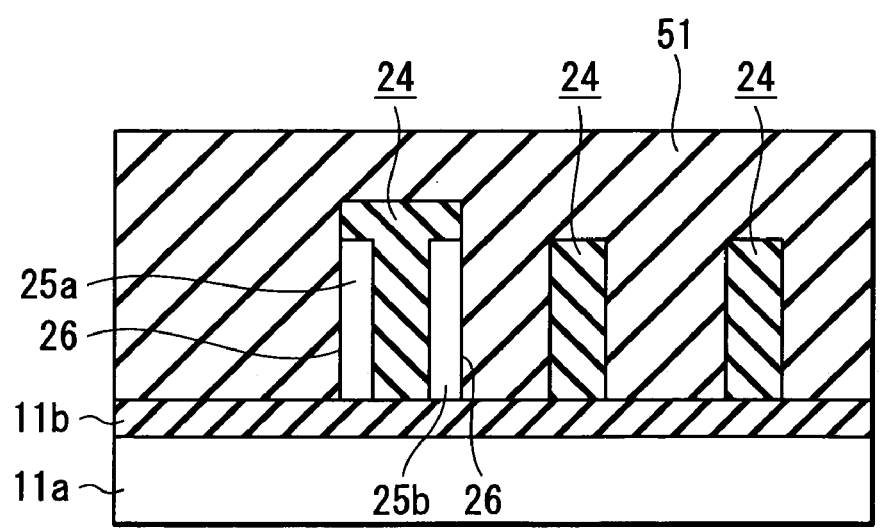
Figure 11A:
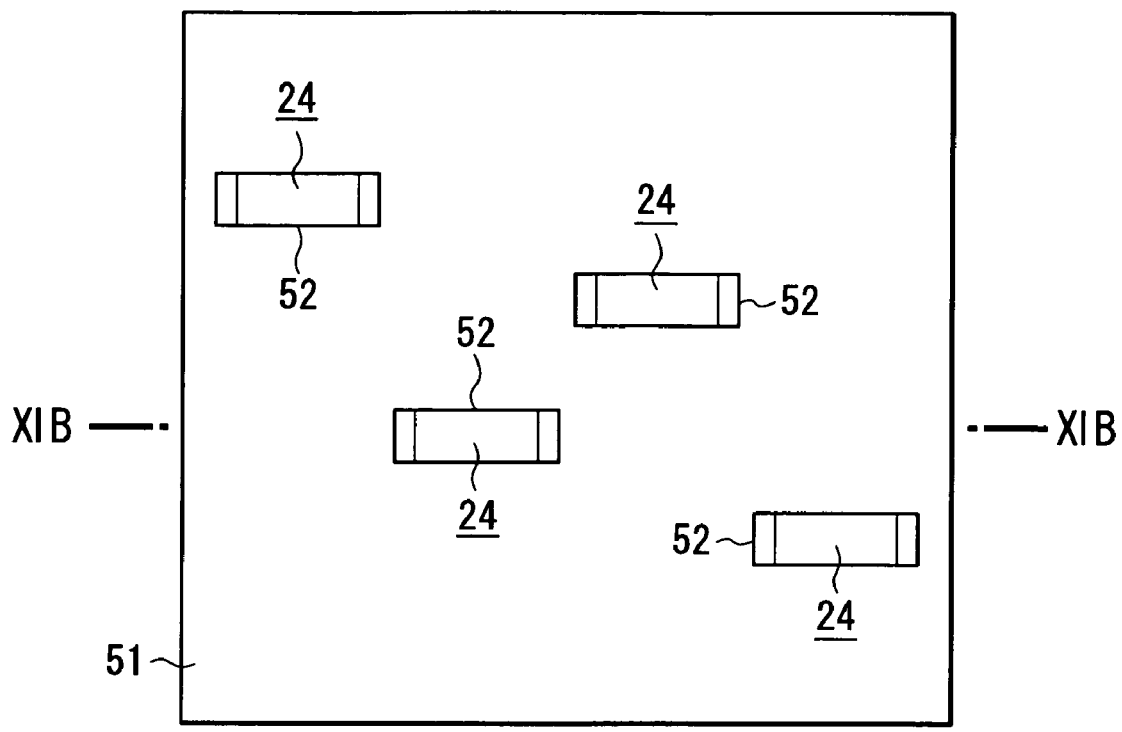
FIGS. 11A and 11B are diagrams to help explaining a method of forming a gate electrode in a Projection.
Figure 11B:
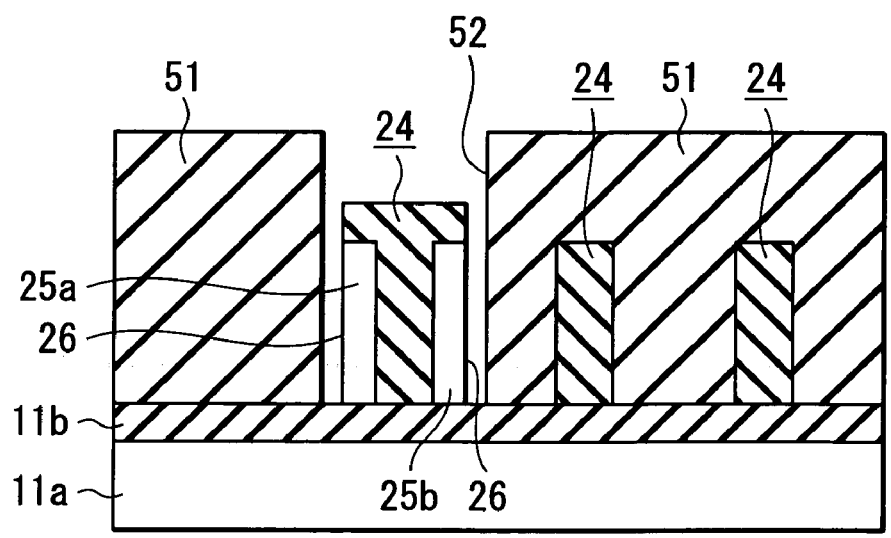
Figure 12A:
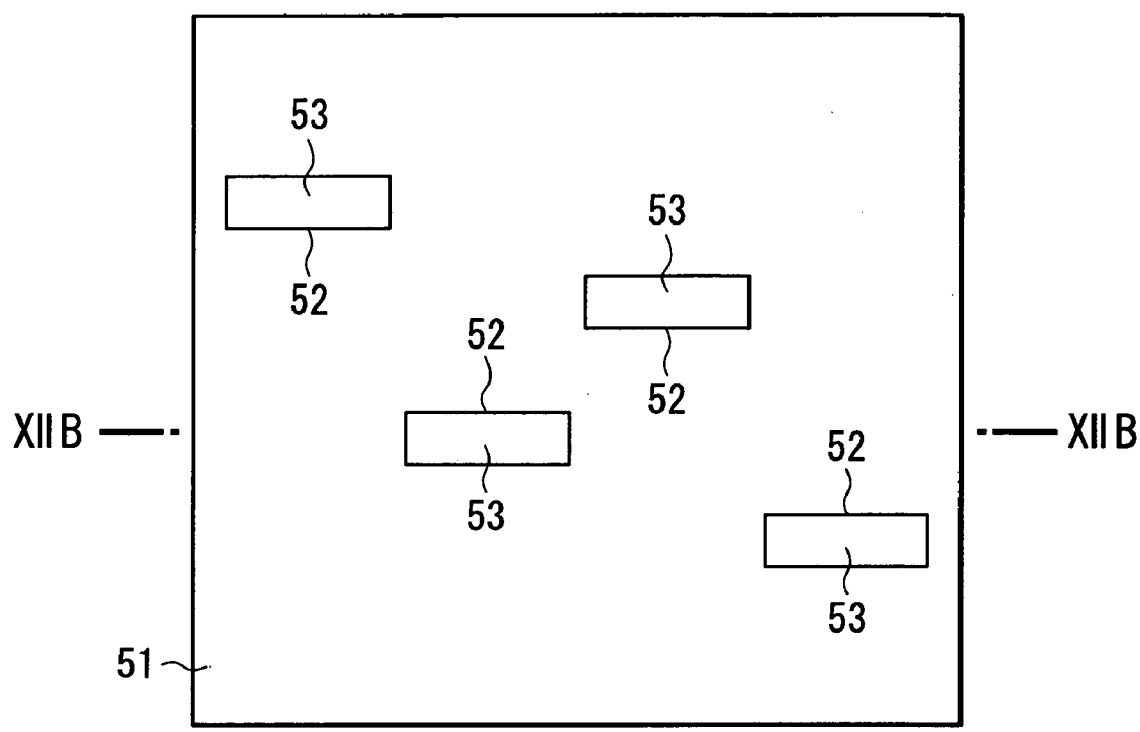
FIGS. 12A and 12B are diagrams to help explaining a method of forming a gate electrode in a Projection.
Figure 12B:
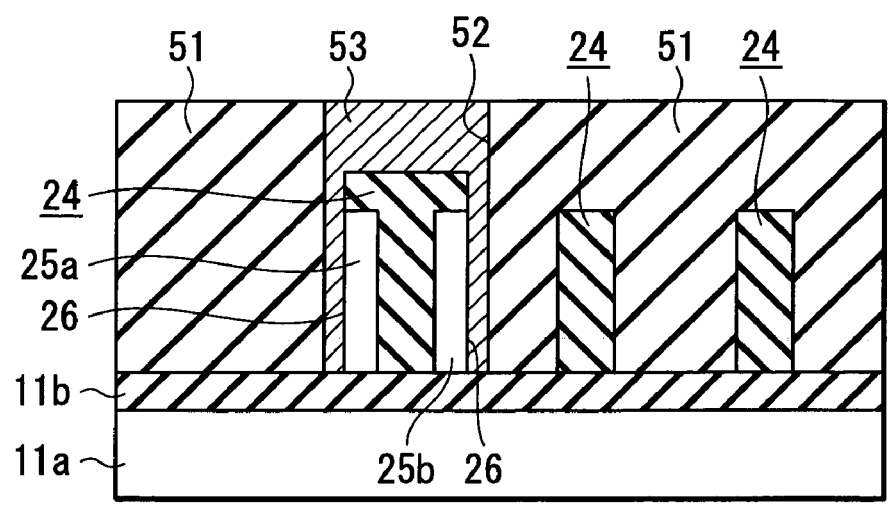

First, after gate dielectric films 26 are formed on the side surfaces of the Si-fins 25a, 25b, the spacings among the Projections 20A, 20B, 20C, 20D are filled in with a third insulating film, for example, a BSG (Boron-Silicate Glass) film 51. Then, the surface of the BSG film 51 is planarized by a CMP process (see FIGS. 10A and 10B). Next, the BSG film 51 on the regions corresponding to the gate electrodes 23 to be formed is removed by a lithography process and an RIE process, thereby forming openings 52 (see FIGS. 11A and 11B). Then, polysilicon 53 is deposited by, for example, CVD techniques so as to fill the openings 52. Then, the surface of the polysilicon 53 is planarized by a CMP process (see FIGS. 12A and 12B).

Then, the BSG films 51 left among the Projections 20A, 20B, 20C, 20D are selectively etched, thereby exposing the polysilicon 53. In this way, for example, a gate electrode 23 is formed which interposes, from upper side, a projecting part composed of the Si-fins 25a, 25b and insulating film 24 in between as shown in FIGS. 2A and 2B. In this state, with the gate electrode 23 as a mask, the Si-fins 25a, 25b almost perpendicular to the SOI substrate 11 is subjected to ion implantation (I/I), thereby forming an extension region (not shown).

Figure 13A:
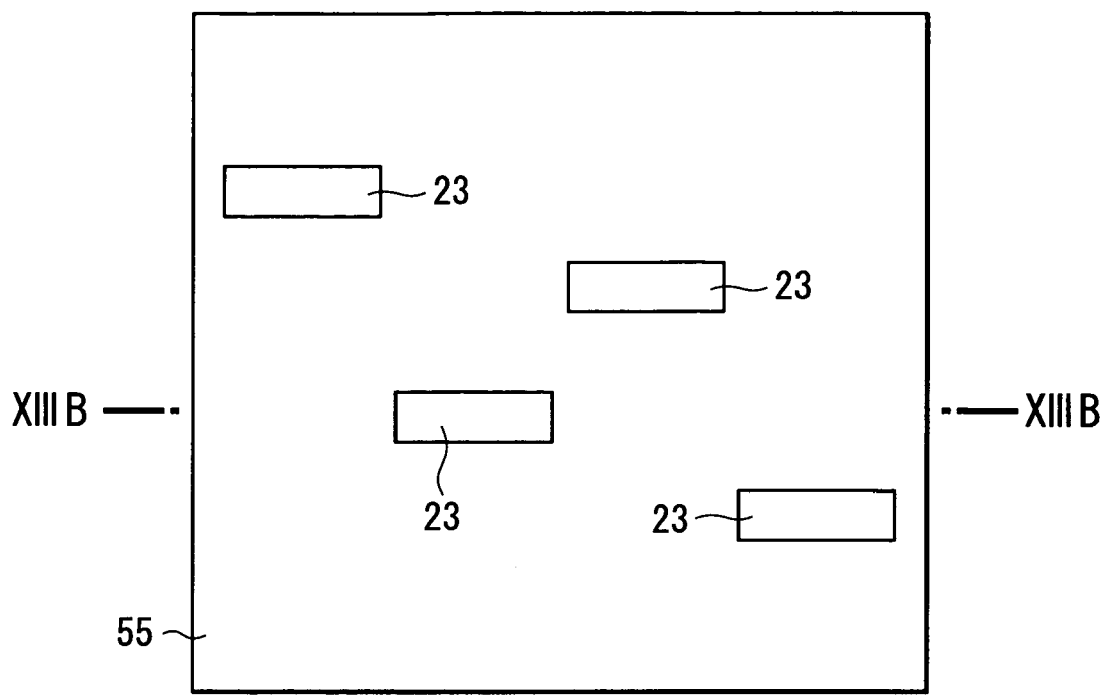
FIGS. 13A and 13B are diagrams to help explaining a method of forming a sidewall in a Projection.
Figure 13B:
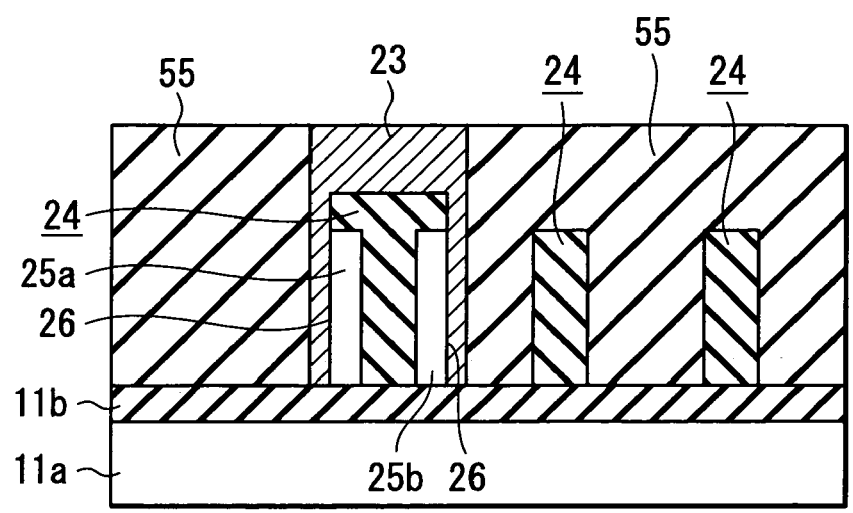
Figure 14A:
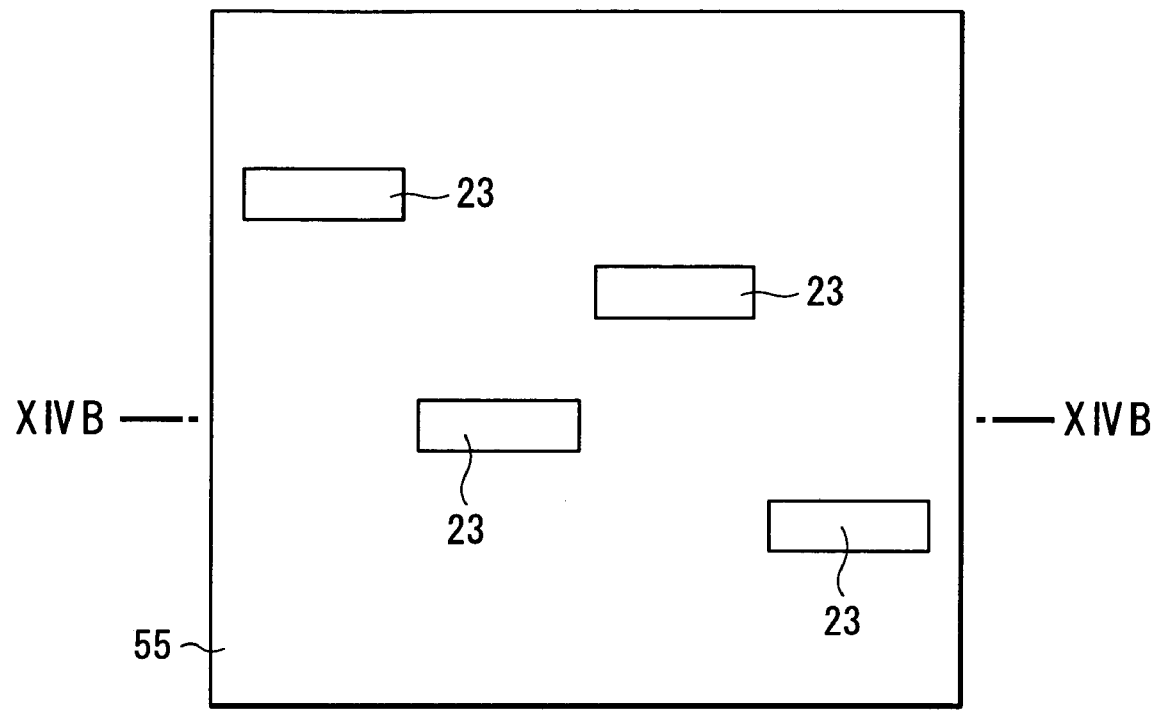
FIGS. 14A and 14B are diagrams to help explaining a method of forming a sidewall in a Projection.
Figure 14B:
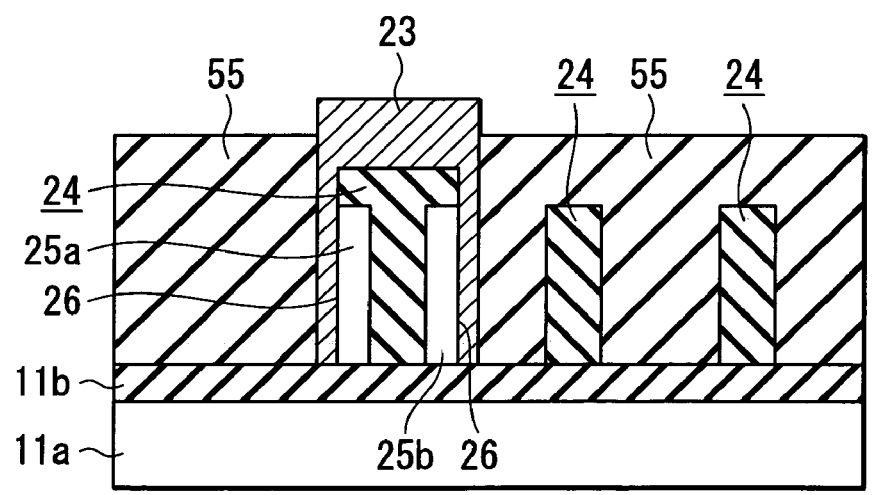
Figure 15A:
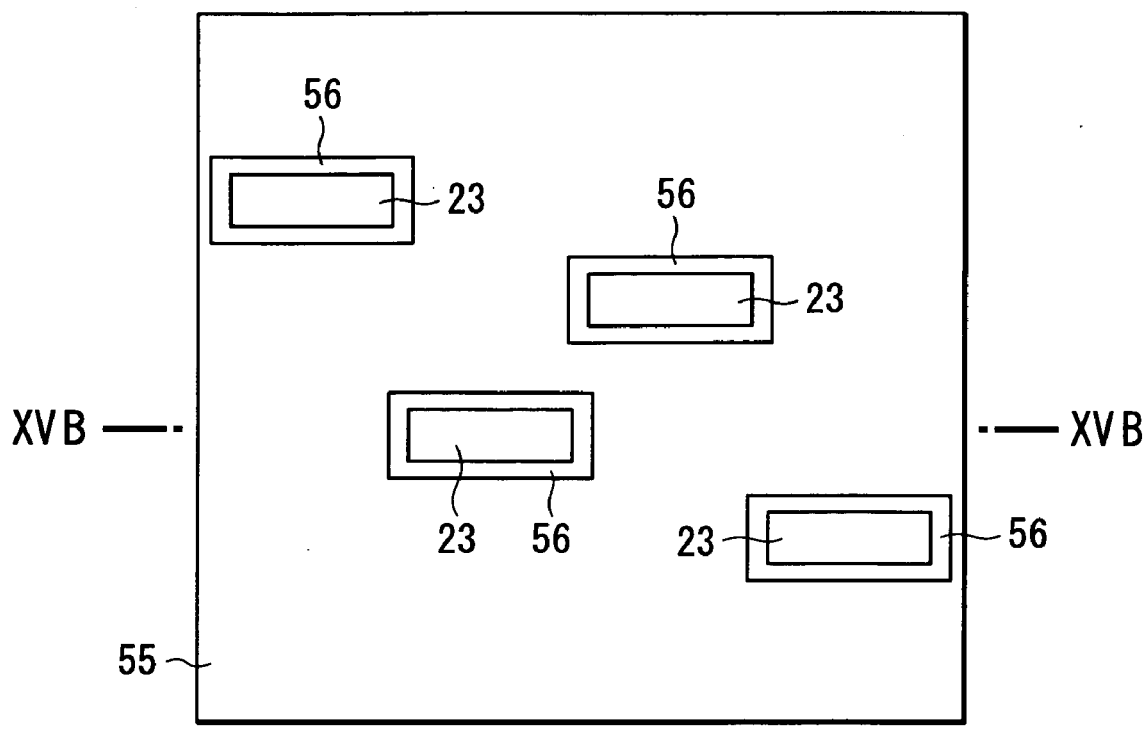
FIGS. 15A and 15B are diagrams to help explaining a method of forming a sidewall in a Projection.
Figure 15B:
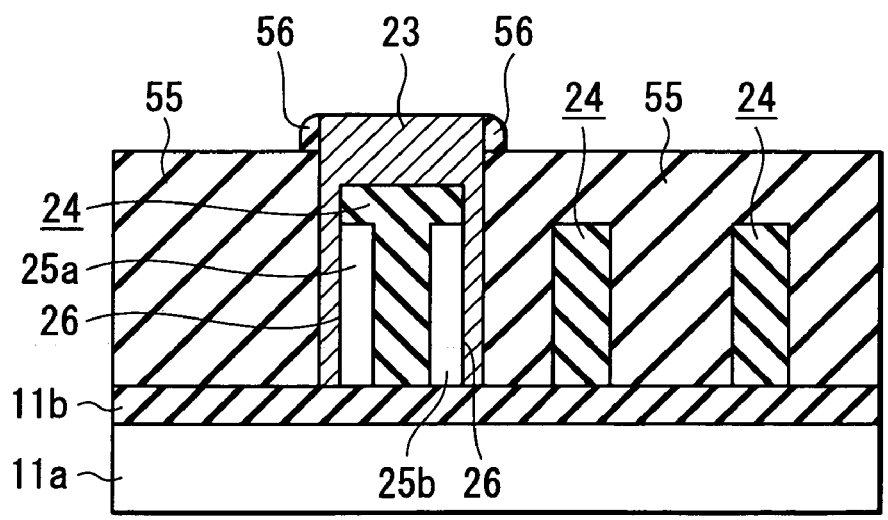
Figure 16A:
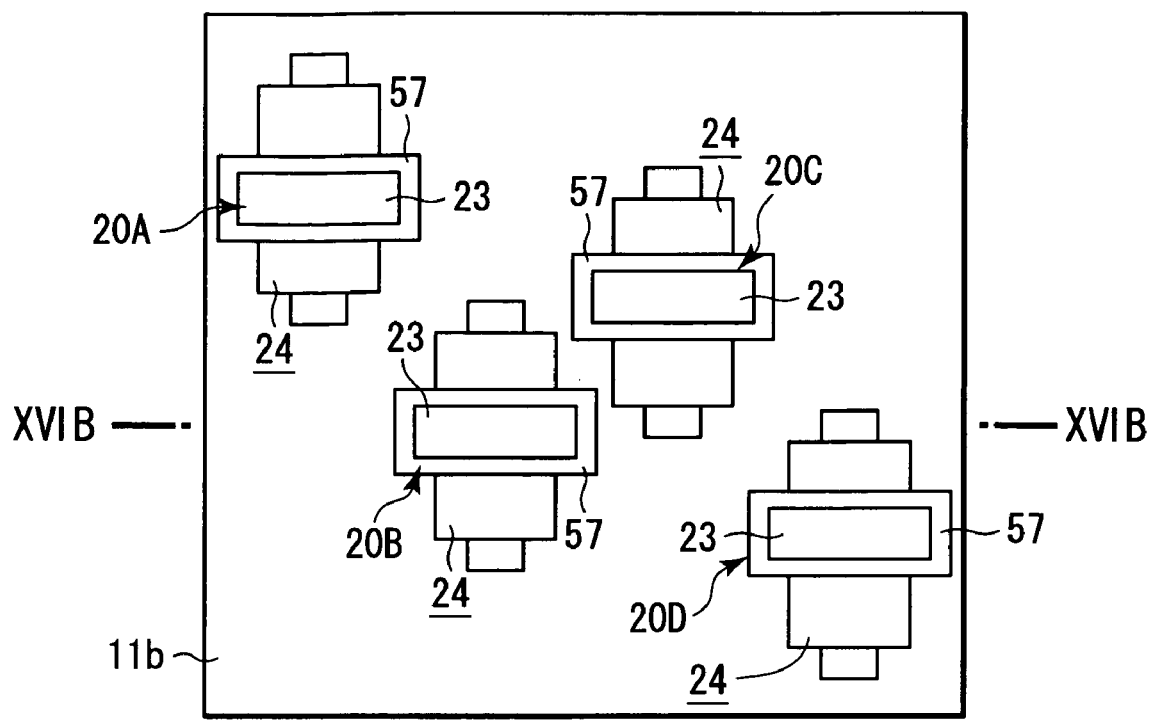
FIGS. 16A and 16B are diagrams to help explaining a method of forming a sidewall in a Projection.
Figure 16B:
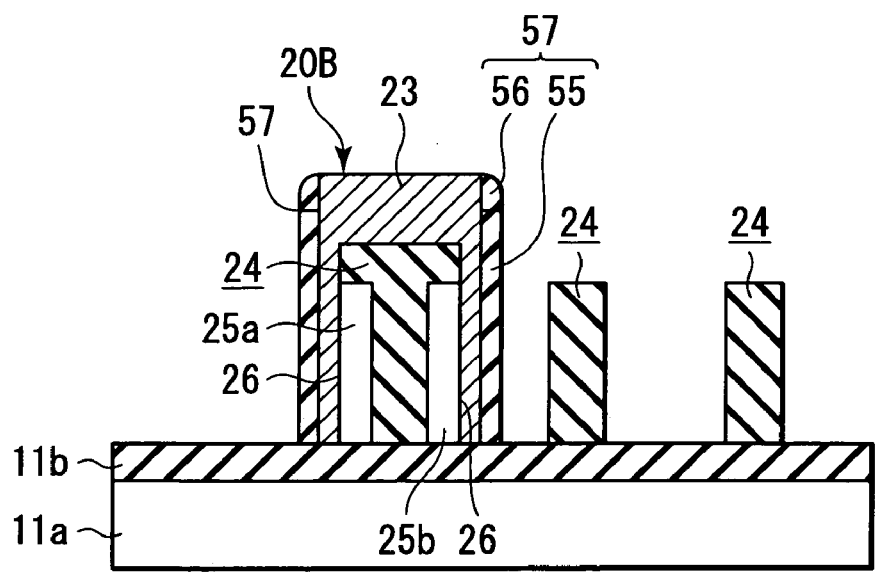

Next, the spacings among the Projections 20A, 20B, 20C, 20D are filled again with, for example, a BSG film (a fourth insulating film) 55. Then, its surface is planarized by a CMP process (see FIGS. 13A and 13B). Next, the surface of the BSG film 55 is etched back, thereby exposing a part of the gate electrode 23 (see FIGS. 14A and 14B). Next, a fifth insulating film serving as a part of a sidewall, for example, an SiN film 56 having a different etching rate from the BSG film 55 is deposited. Thereafter, the SiN film 56 is etched, thereby leaving the SiN film 56 only to surround side surfaces of the gate electrode 23 to form the sidewall (see FIGS. 15A and 15B). Next, with the SiN film 56 as a mask, the BSG film 55 is selectively etched. As a result, the BSG film 55 is left only on the periphery of the gate electrode 23, thereby forming a sidewall 57 made of the SiN film 56 and BSG film 55 (see FIGS. 16A and 16B).

Then, in this state, with the sidewall 57 as a mask, the side surfaces of the Si-fins 25a, 25b almost perpendicular to the SOI substrate 11 are subjected to ion implantation (I/I). As a result, n-type or p-type Si-fins 25a, 25b are formed as described above. Thereafter, cobalt (Co) or the like is sputtered, thereby causing silicidataion. As a result, a silicide film (not shown) is formed only on the side surfaces of the Si-fins 25a, 25b not covered with the sidewall 57. As described above, the formation of the n-type or p-type Si-fins 25a, 25b and the formation of the silicide film are performed in a self-aligned manner, with the sidewall 57 as a mask.

Figure 17A:
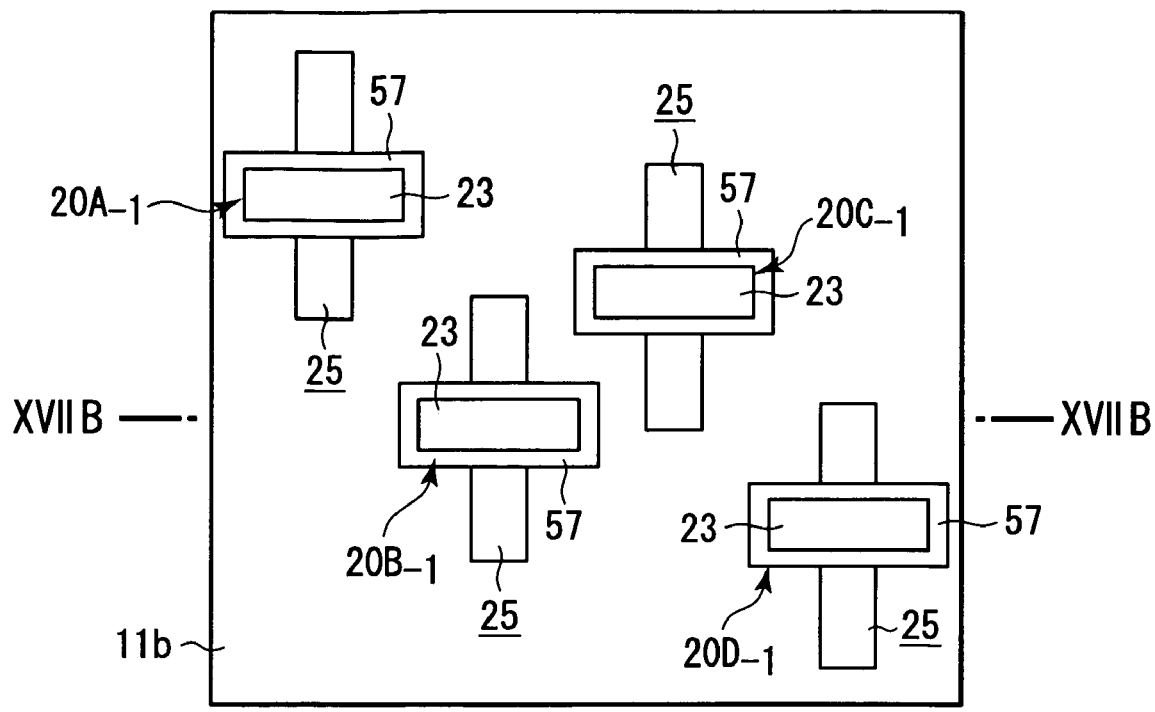
FIGS. 17A and 17B show another configuration of a Projection to help explaining a method of forming a sidewall in the Projection.
Figure 17B:
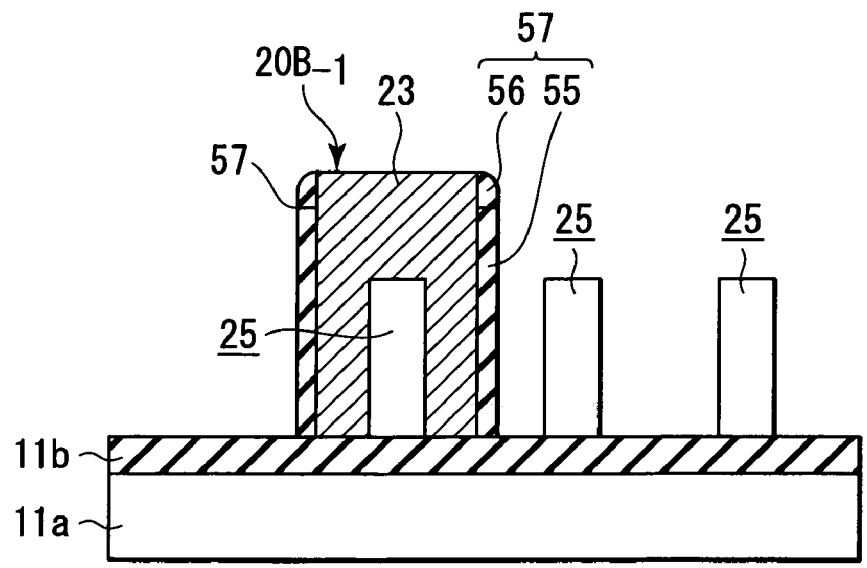

In the second embodiment, the sidewall forming method has been explained, taking as an example the Projections 20A, 20B, 20C, 20D each provided with the Si-fins 25a, 25b and insulating film 24. The method is not limited to the second embodiment. For instance, the method may be applied equally to Projections (MOS transistors with a three-dimensional structure) $20A_{-1}$, $20B_{-1}$, $20C_{-1}$, $20D_{-1}$, which are composed of only a Si-fin 25 as shown in FIGS. 17A and 17B.

In the above manufacturing method, when a gate electrode is formed in a Projection, it is not necessary a process to remove the gate electrode material on the non-gate region of the Si-fin. This makes it possible to avoid overetching a substrate or a problem caused by etching off the cap layer on the top of the Si-fin.

Since it is easy to remove the insulating film in the region other than the sidewall formation region in forming a sidewall, the side surface of the Si-fin can be exposed completely, which enables a uniform silicidation of the Si-fin. Specifically, a sidewall can be formed only periphery of the gate electrode without overetching. Thus, the formation of the source and drain and silicidation can be performed in a self-aligned manner with the sidewall served as the mask.

Figure 9:
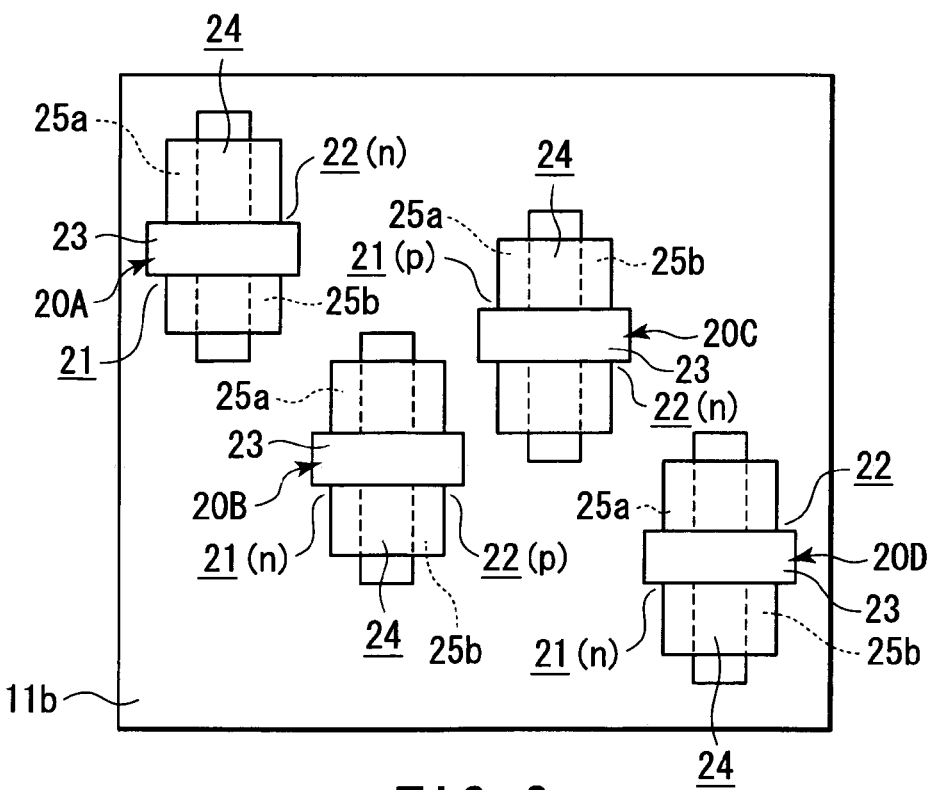
FIG. 9 is a plan view of an example of a layout of Projections in the SRAM cell of FIG. 8.
Figure 18A:
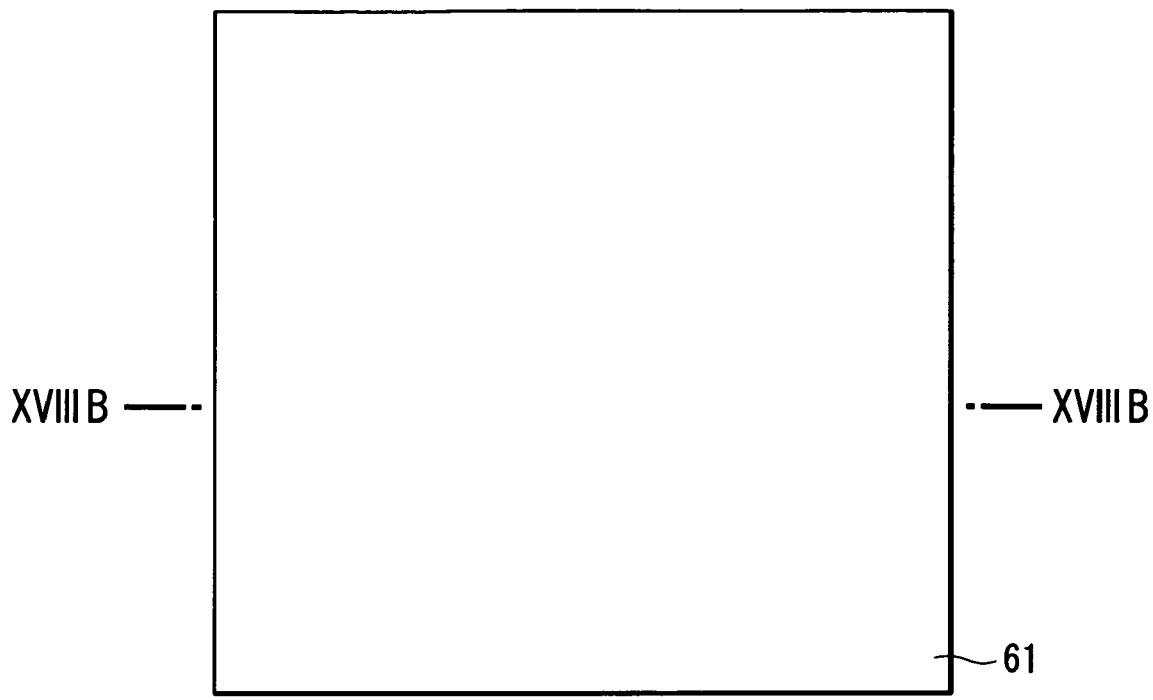
FIGS. 18A and 18B are diagrams to help explaining a method of manufacturing an SRAM cell of FIG. 8.
Figure 18B:
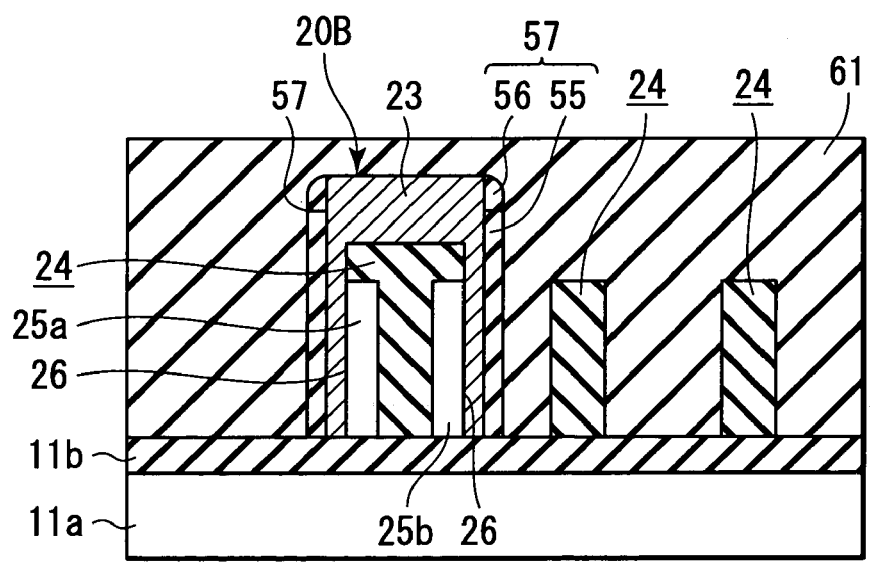
Figure 19A:
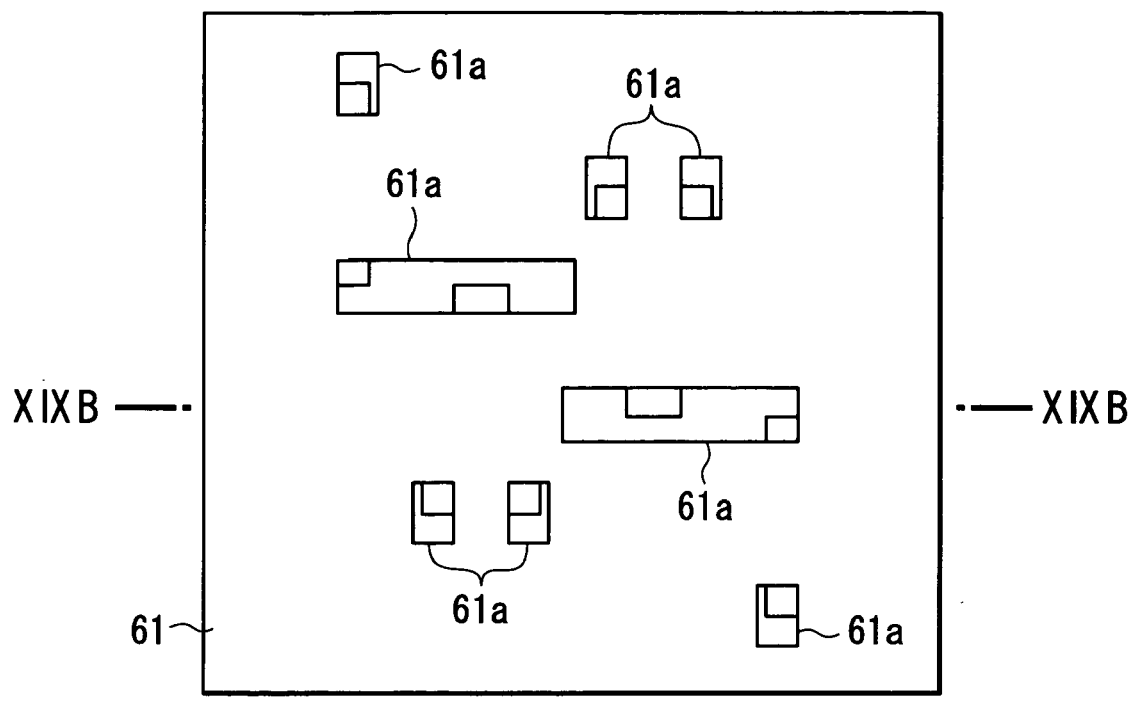
FIGS. 19A and 19B are diagrams to help explaining a method of manufacturing an SRAM cell of FIG. 8.
Figure 19B:
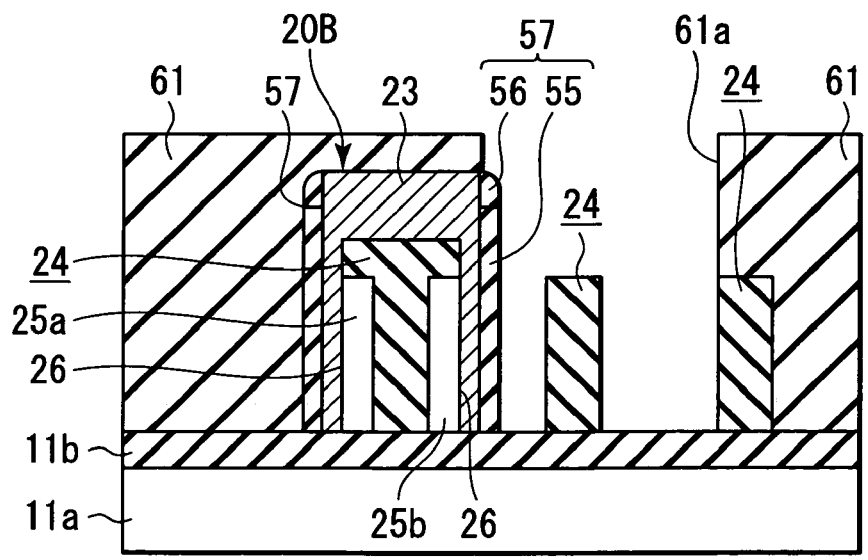
Figure 20A:
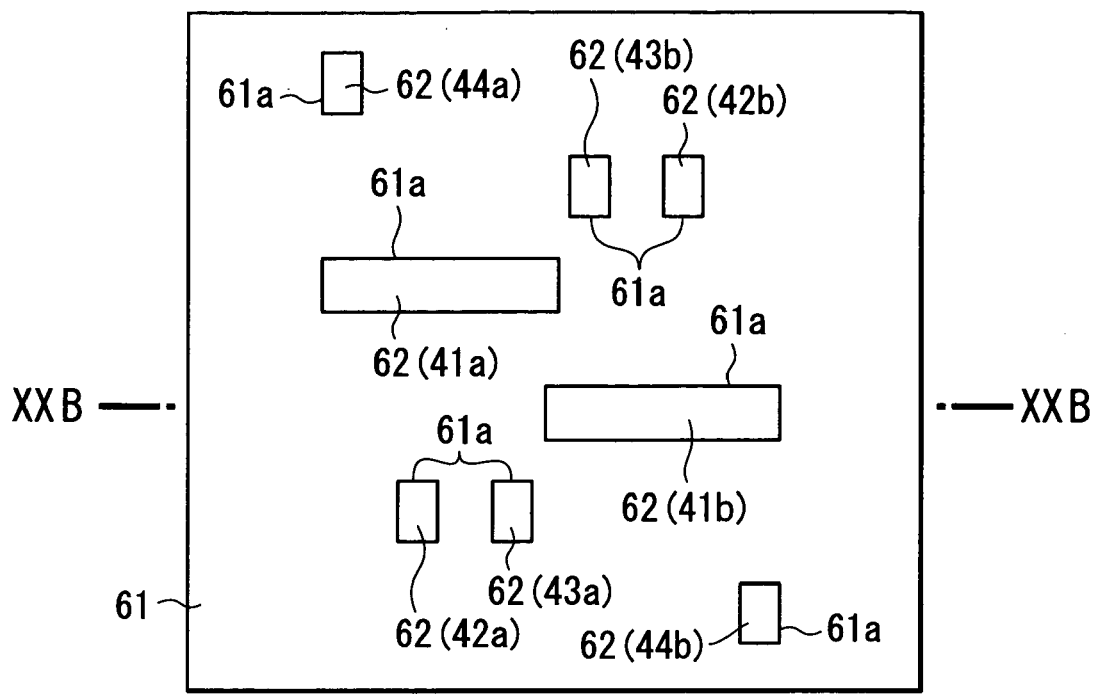
FIGS. 20A and 20B are diagrams to help explaining a method of manufacturing an SRAM cell of FIG. 8.
Figure 20B:
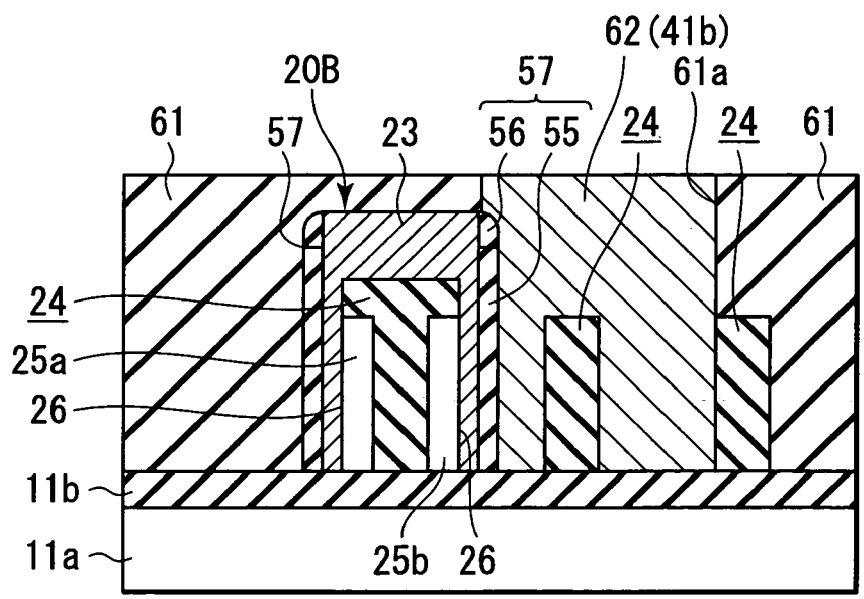

As described above, after predetermined n-type MOS transistors and p-type MOS transistors are formed (for example, see FIG. 9), SRAM cells are manufactured as follows. First, the spacings among the four Projections 20A, 20B, 20C, 20D are filled with an insulating film, for example, a BSG film 61. Then, its surface is planarized (see FIGS. 18A and 18B). Next, the BSG film 61 in the areas corresponding to the metal wirings 41a, 41b to be formed and the contacts 42a, 42b, 43a, 43b, 44a, 44b to be formed is removed by a lithography process and an RIE process, thereby forming openings 61a (see FIGS. 19A and 19B). Then, the openings 61a are filled with metal 62, followed by planarization (see FIGS. 20A and 20B). In this way, the metal wirings 41a, 41b, the Vss contacts 42a, 42b, the Vdd contacts 43a, 43b, and the bit line contacts 44a, 44b are formed, respectively.

Figure 21A:
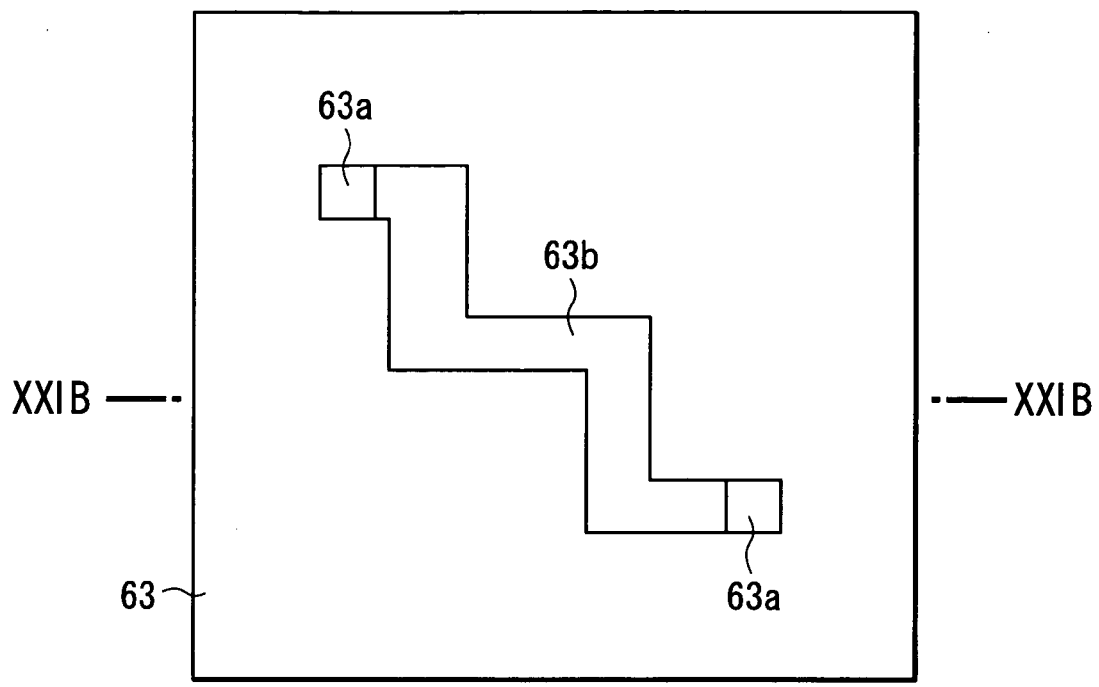
FIGS. 21A and 21B are diagrams to help explaining a method of manufacturing an SRAM cell of FIG. 8.
Figure 21B:
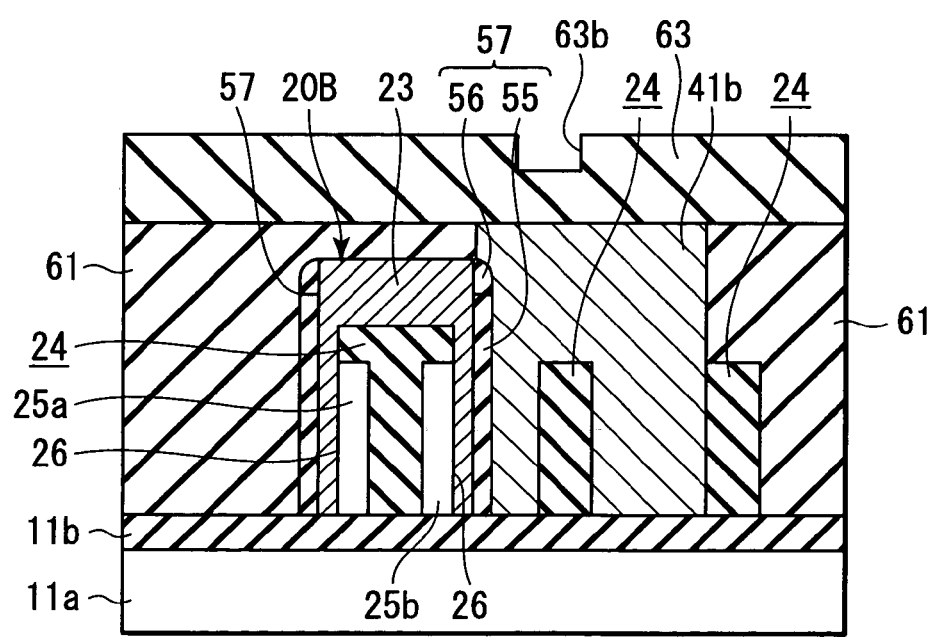
Figure 22A:
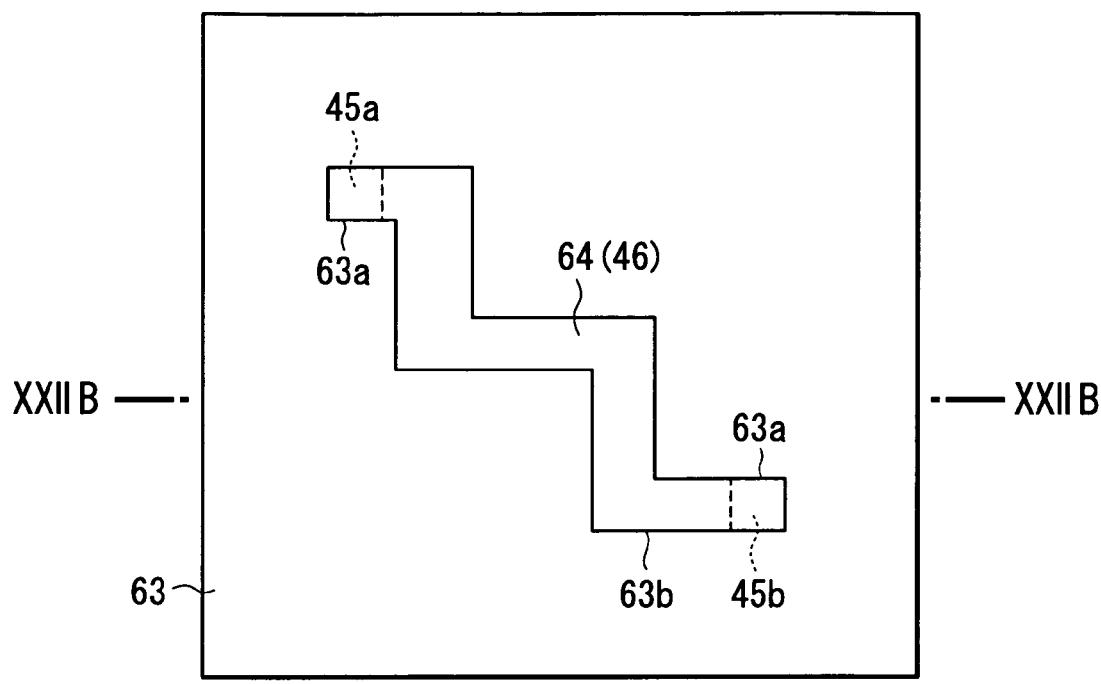
FIGS. 22A and 22B are diagrams to help explaining a method of manufacturing an SRAM cell of FIG. 8.
Figure 22B:
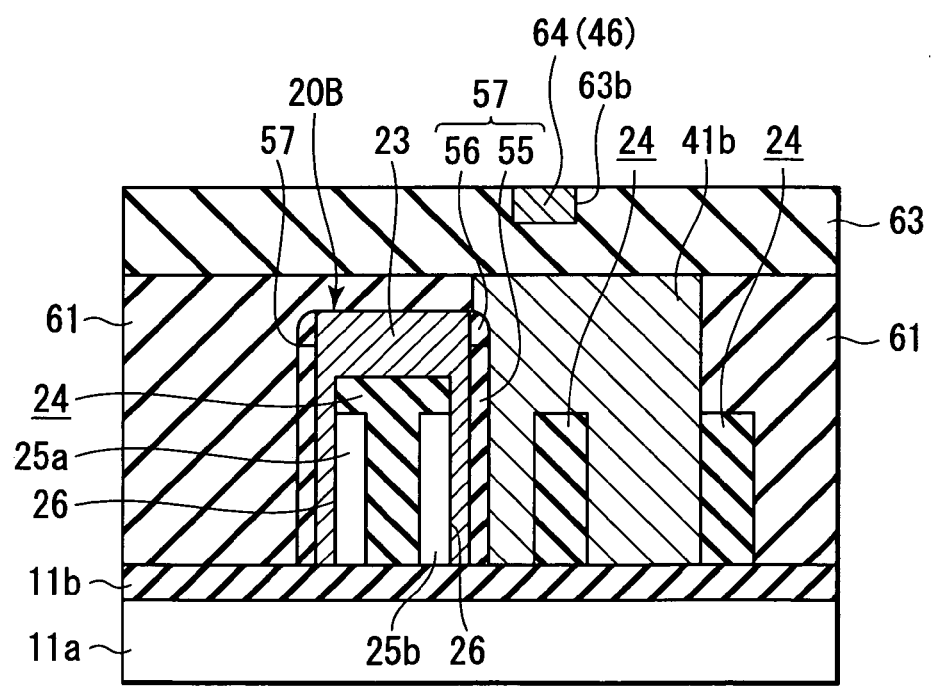

Next, on the entire surface, an interlevel dielectric film, such as a TEOS film 63, is deposited. Then, the TEOS film 63 in the areas corresponding to the word line contacts 45a, 45b to be formed and the upper-level wiring 46 to be formed is removed, thereby forming openings 63a and a trench 63b (see FIGS. 21A and 21B). At this time, the trench 63b is formed so as not to cross the Vss contacts 42a, 42b and the Vdd contacts 43a, 43b. Next, the openings 63a and the trench 63b are filled with metal 64 by damascene techniques or the like, thereby not only forming the upper-level wiring 46 but also connecting the word line contacts 45a, 45b with each other (see FIGS. 22A and 22B).

Finally, the connection of the Vss wirings (not shown) to the Vss contacts 42a, 42b, the connection of the Vdd wirings (not shown) to the Vdd contacts 43a, 43b, and the connection of the bit lines (not shown) to the bit line contacts 44a, 44b are made. In this way, for example, as shown in FIG. 8, a 6-transistor-structure SRAM cell is completed which is composed of four Projections 20A, 20B, 20C, 20D.

In the second embodiment, a metal plug (word line contacts 45a, 45b) can be contacted with the gate electrode on the top of the projecting part (the insulating film and Si-fin). As a result, the cell area can be reduced (or made smaller).

Figure 23:
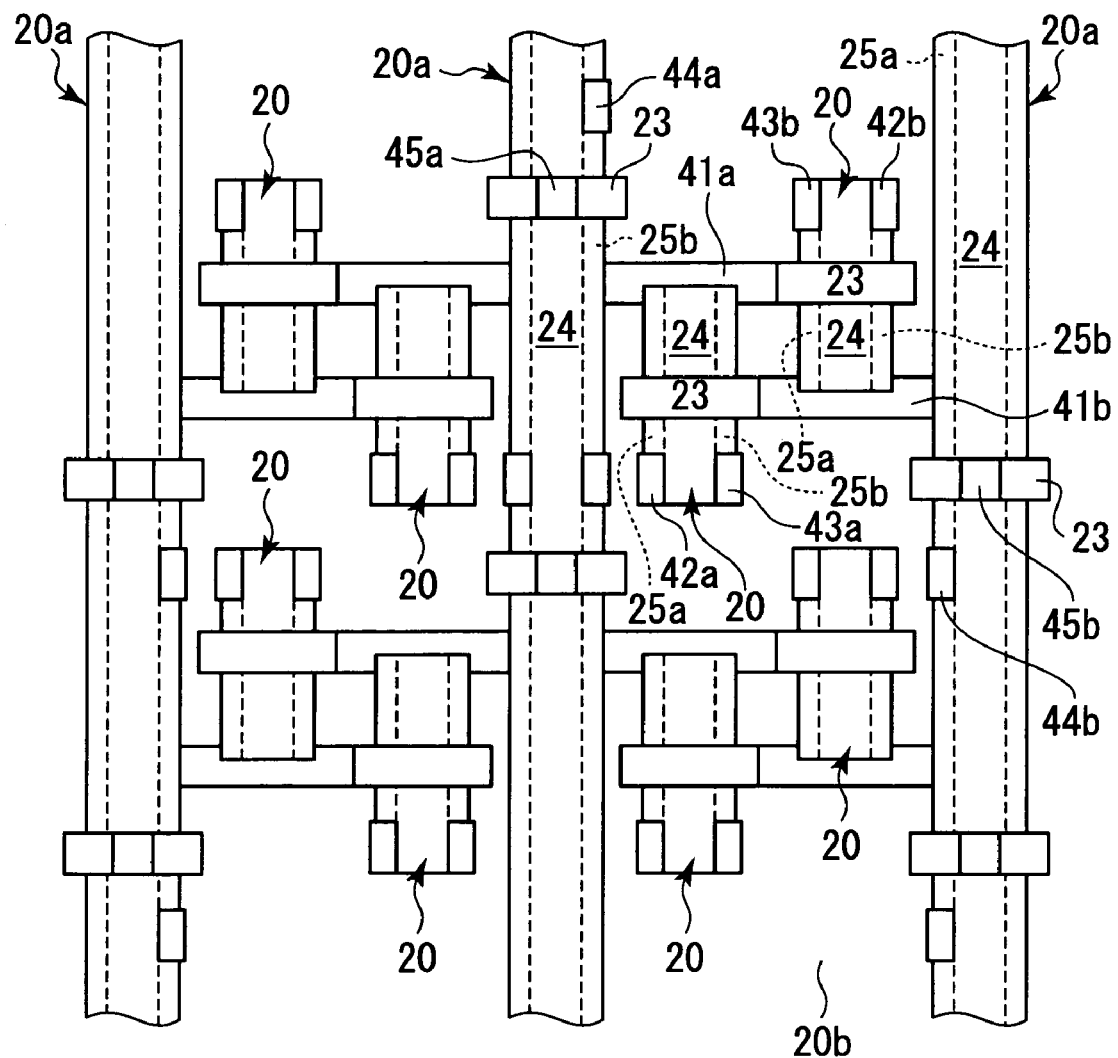
FIG. 23 is a plan view showing an example of the integration of SRAM cells as shown in FIG. 8.
Figure 24A:
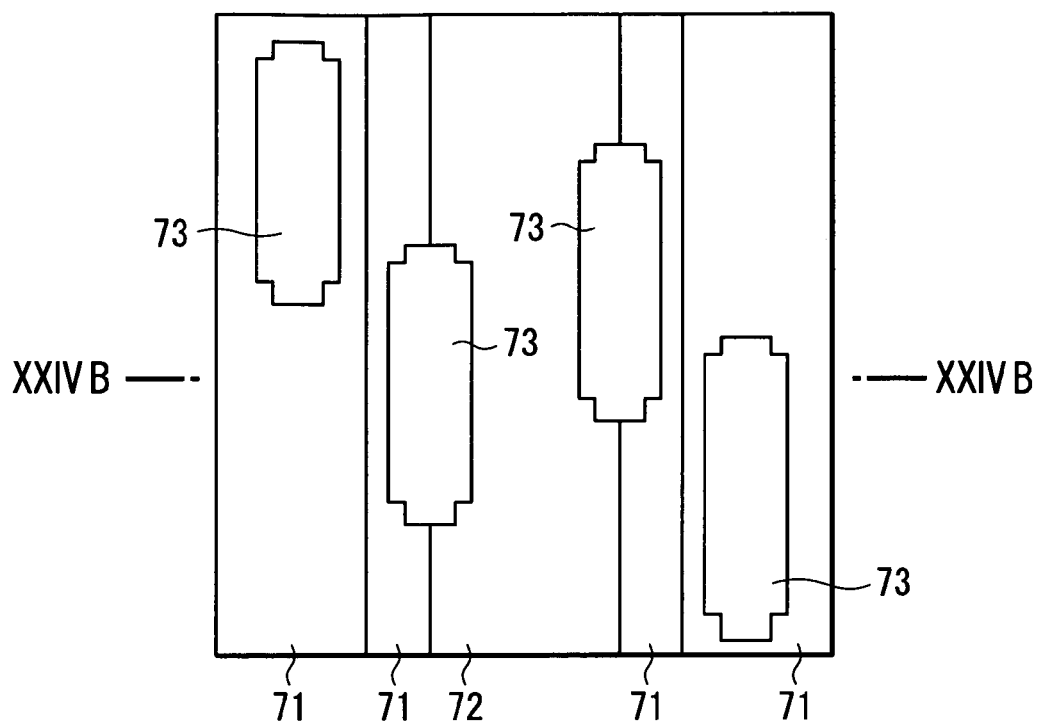
FIGS. 24A and 24B are diagrams to help explaining another method of forming Projections according to a third embodiment of the present invention.
Figure 24B:
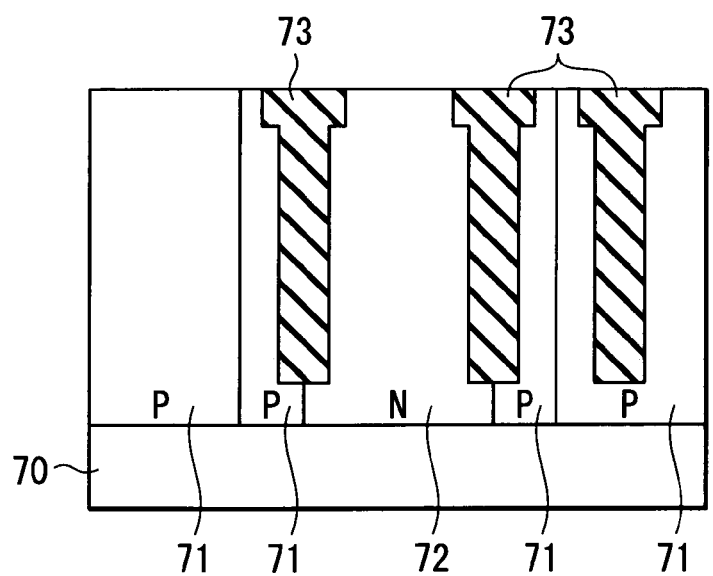

FIG. 23 shows a case where a plurality of SRAM cells are integrated, each cell composed of four Projections. When a plurality of SRAM cells are integrated, some projections 20a out of a plurality of projections composed of two Si-fins 25a, 25b and one insulating film 24 are made longer. The longer projections 20a are arranged in parallel with one another, thereby forming many transfer transistors in each projections 20a. With this configuration, a plurality of SRAM cells can be integrated in the longitudinal direction other of the projections 20a longer than projections 20.

In this example, the spacings among the projections 20, 20a, the spacings among the metal wirings 41a, 41b, and the spacings among the gate electrodes 23 are filled with an insulating film 20b. This prevents unnecessary short circuits even when a plurality of SRAM cells are integrated.

As described above, although the Si-fins are thin in width, they are resistant to lie down. Therefore, it is possible to increase not only the height but also the length of the Si-fins easily. This is advantageous from a layout viewpoint, when Projections are integrated, for example, when SRAM cells are integrated.

Third Embodiment

FIGS. 24A and 24B to FIGS. 27A and 27B show another configuration of a Projection according to a third embodiment of the present invention. Explanation will be given in a case where a Si bulk substrate is used in a fabrication of a Projection composed of the aforementioned two Si-fins and a single insulating film.

When a bulk substrate 70 is used, a p-well (a first well region) 71 is formed by ion implantation in advance in an area where an n-type MOS transistor is being formed, and an n-well (a second well region) 72 is formed by ion implantation in advance in an area where a p-type MOS transistor is being formed. The formation of the wells 71, 72 enables to isolate effectively among Si-fins having different conductivity type. Then, insulating films (for example, TEOE films) 73 with a projected section are formed on areas corresponding to n-type MOS transistors and p-type MOS transistors are being formed. Each insulating film 73 has an almost T-shaped cross section and is formed so as to be higher than the height of Si-fins formed on a pair of its side surfaces. This makes it possible to isolate effectively among two Si-fins formed in each projecting part.

Figure 25A:
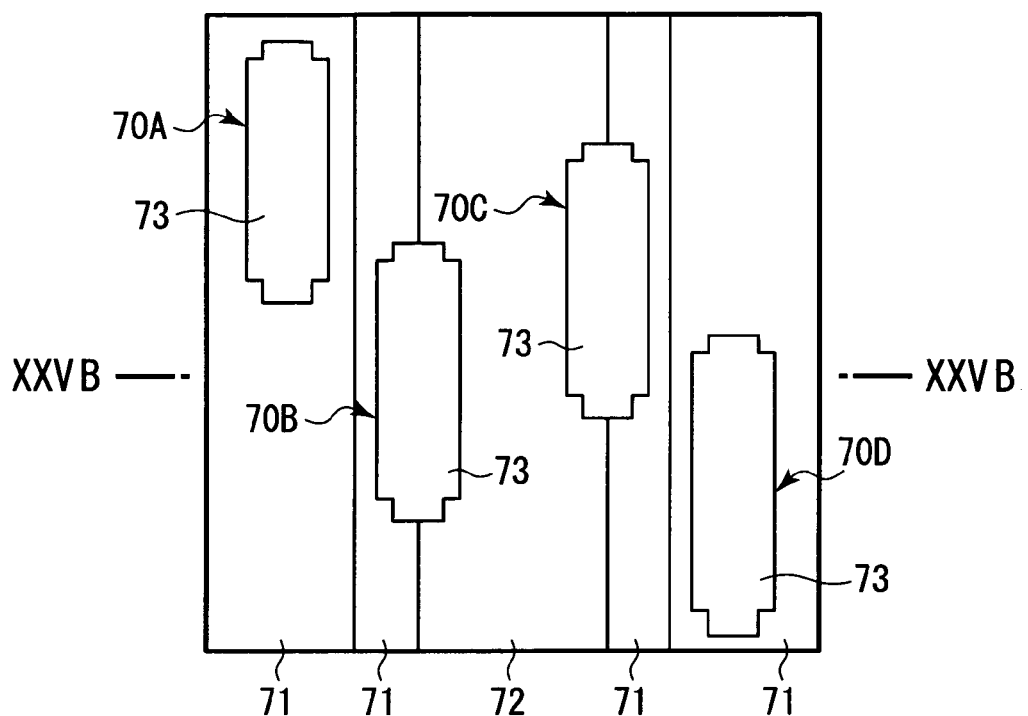
FIGS. 25A and 25B are diagrams to help explaining another method of forming Projections according to the third embodiment.
Figure 25B:
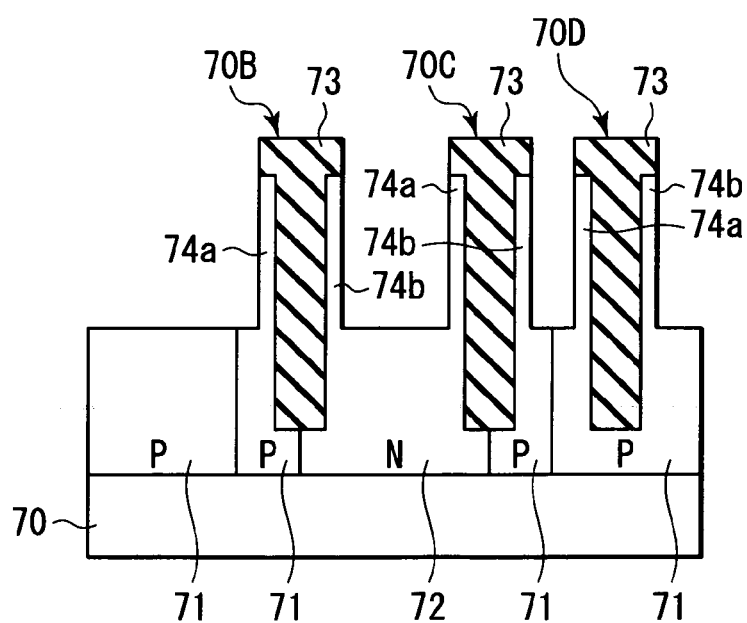

Next, for example, as shown in FIGS. 25A and 25B, the p-well 71 and n-well 72 are etched according to the height of the Si-fin being formed using the insulating film 73 as a mask. As a result, thin Si-fins 74a, 74b are formed in the p-well 71 and the n-well 72 on both side surfaces of each insulating film 73, respectively. That is, four Projections 70A, 70B, 70C, 70D are formed, each having Si-fins 74a, 74b only on a pair of side surfaces of each insulating film 73. In this example, ion implantation and other processes are carried out in such a manner that the Si-fins 74a, 74b of the Projection 70A become the n type, the Si-fin 74a of the Projection 70B becomes the n type, the Si-fin 74b of the Projection 70B becomes the p type, the Si-fin 74a of the Projection 70C becomes the p type, the Si-fin 74b of the Projection 70C becomes the n type, and the Si-fins 74a, 74b of the Projection 70D become the n type.

Figure 26A:
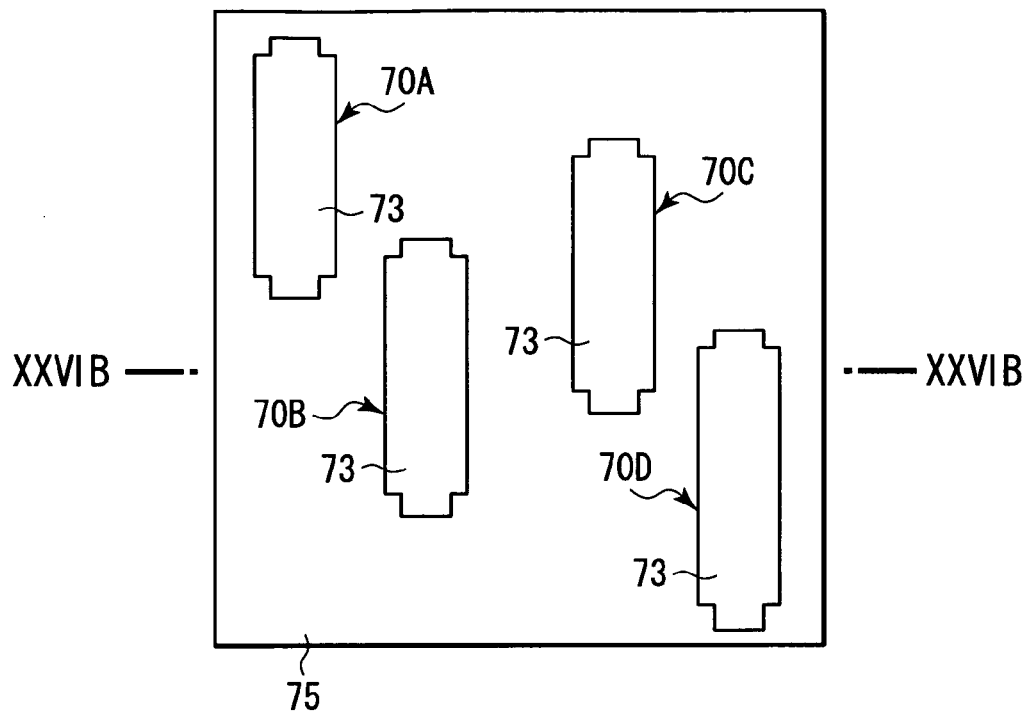
FIGS. 26A and 26B are diagrams to help explaining another method of forming Projections according to the third embodiment.
Figure 26B:
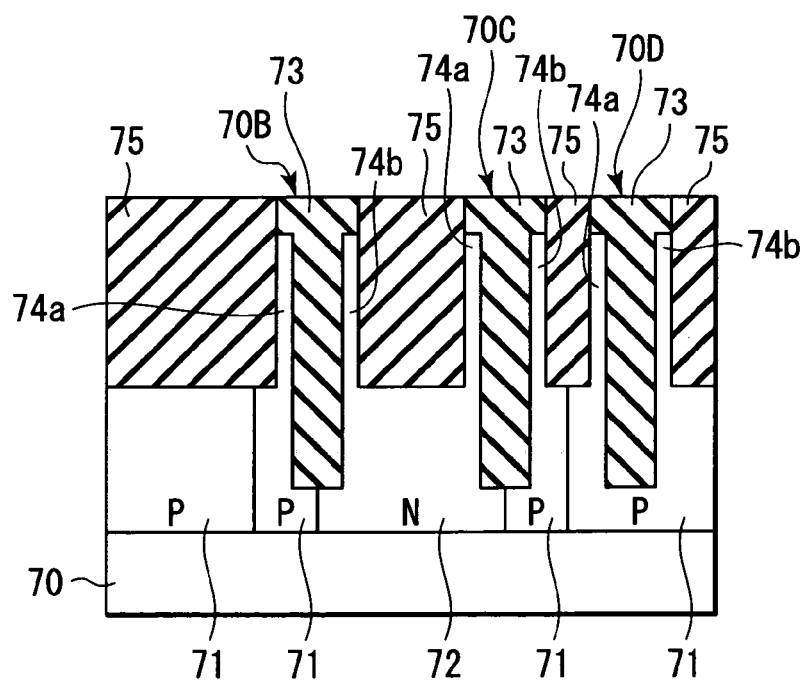
Figure 27A:
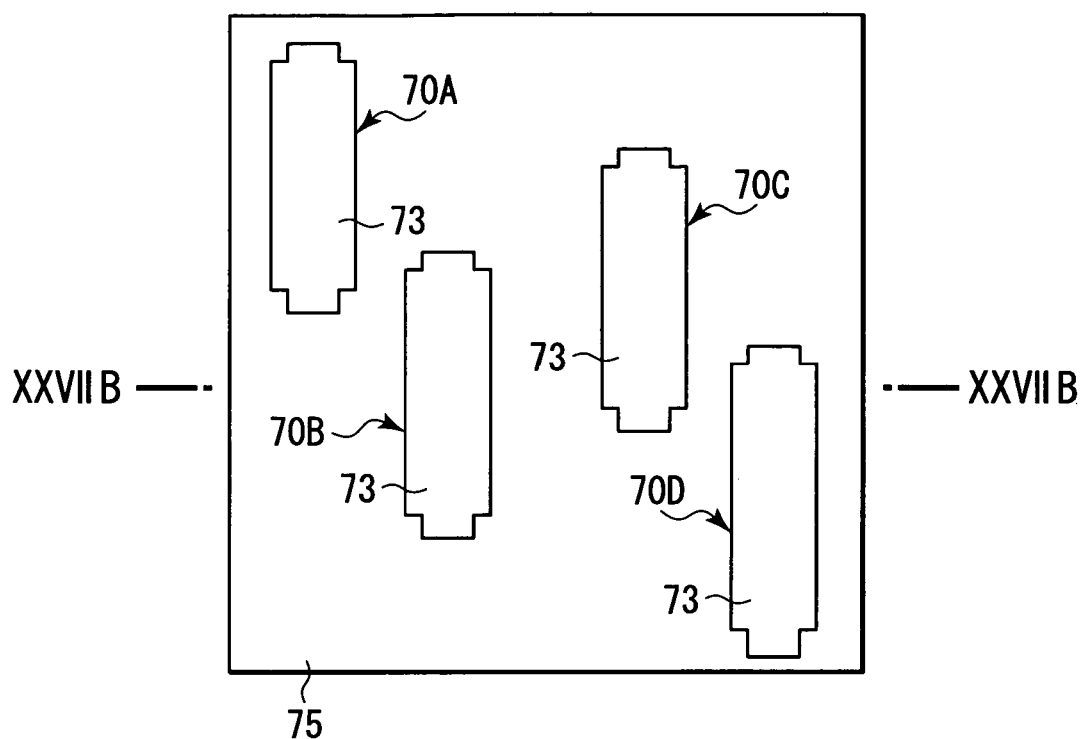
FIGS. 27A and 27B are diagrams to help explaining another method of forming Projections according to the third embodiment.
Figure 27B:
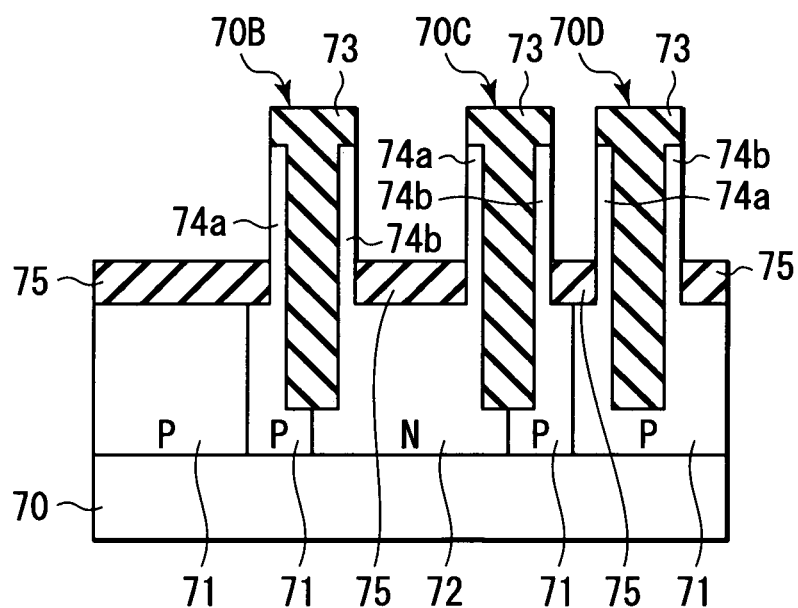
Figure 28A:
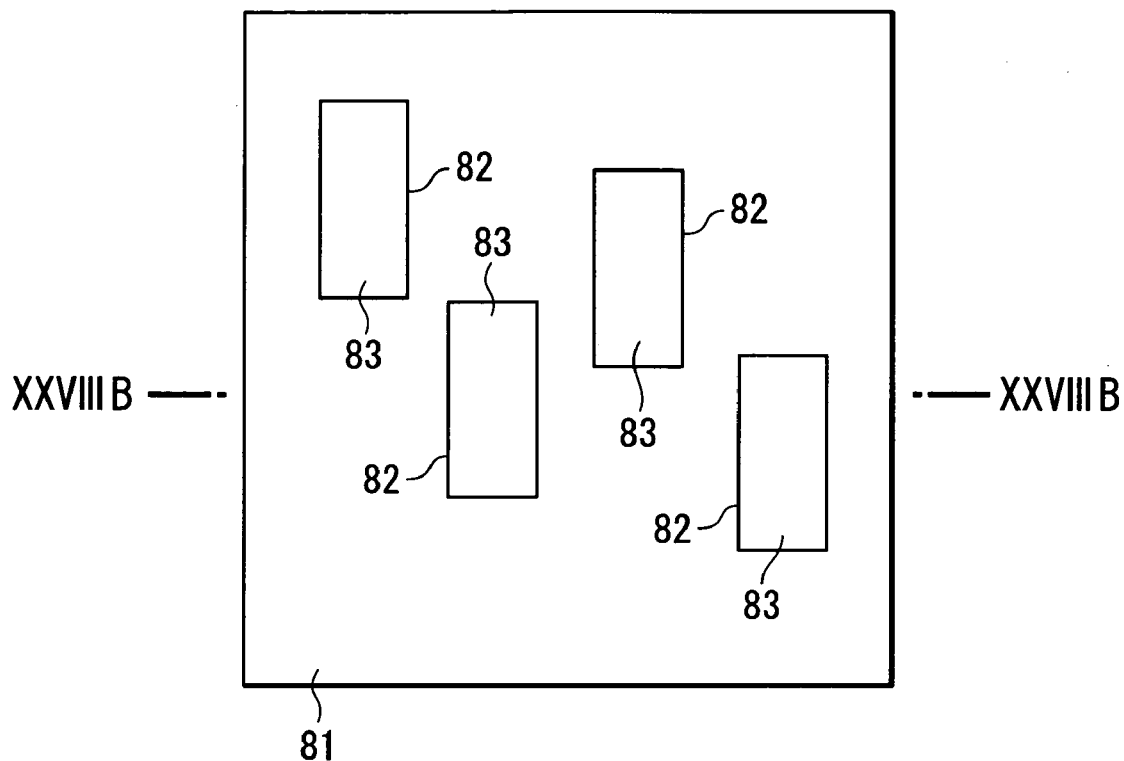
FIGS. 28A and 28B are diagrams to help explaining another method of forming Projections according to a fourth embodiment of the present invention.
Figure 28B:
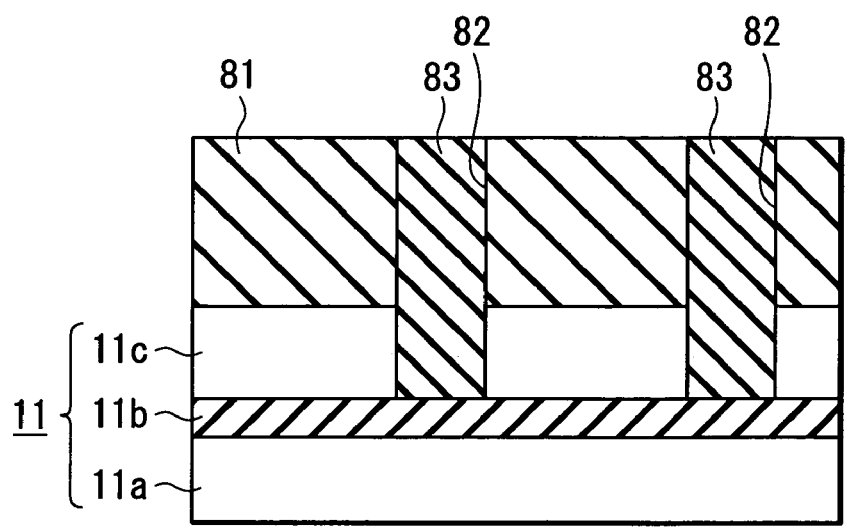
Figure 29A:
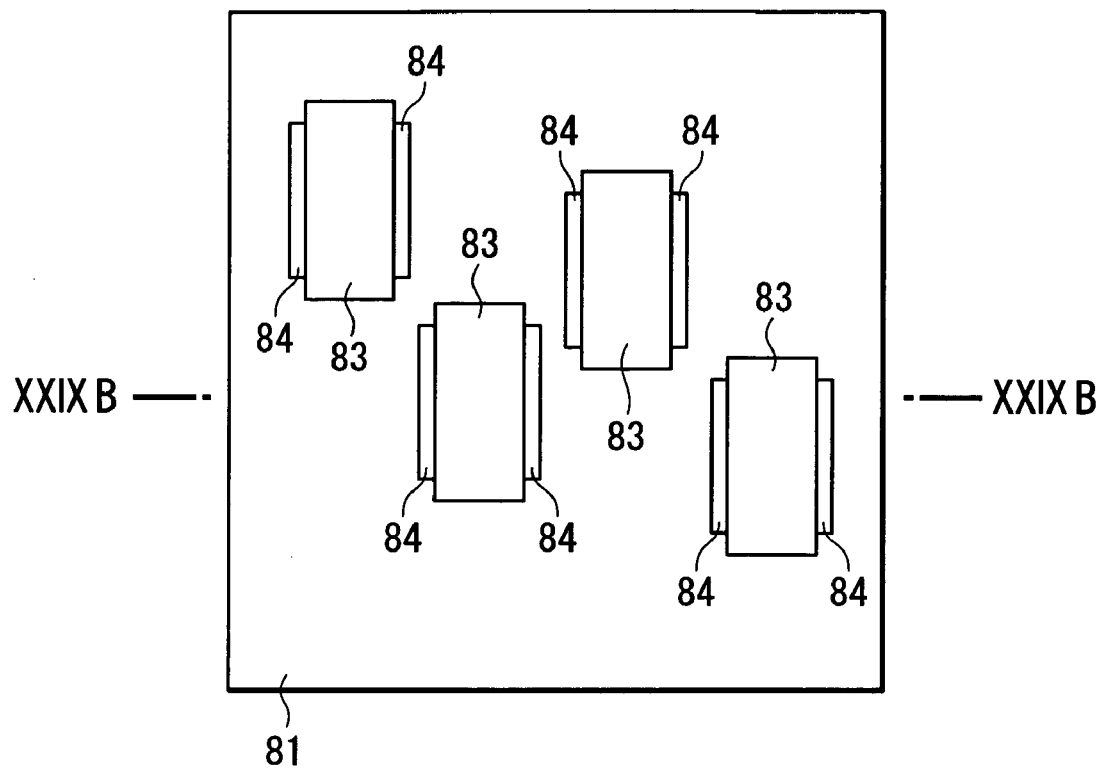
FIGS. 29A and 29B are diagrams to help explaining another method of forming Projections according to the fourth embodiment.
Figure 29B:
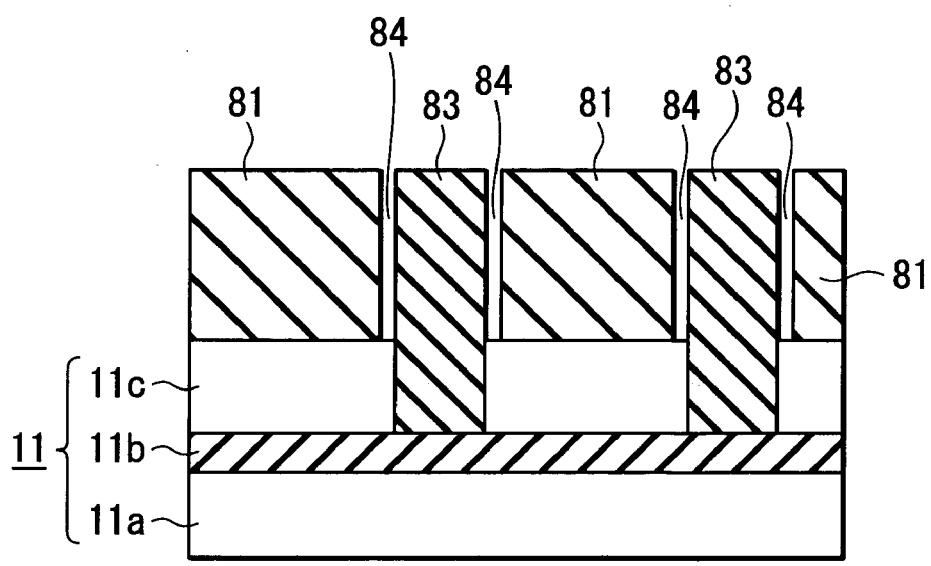
Figure 30A:
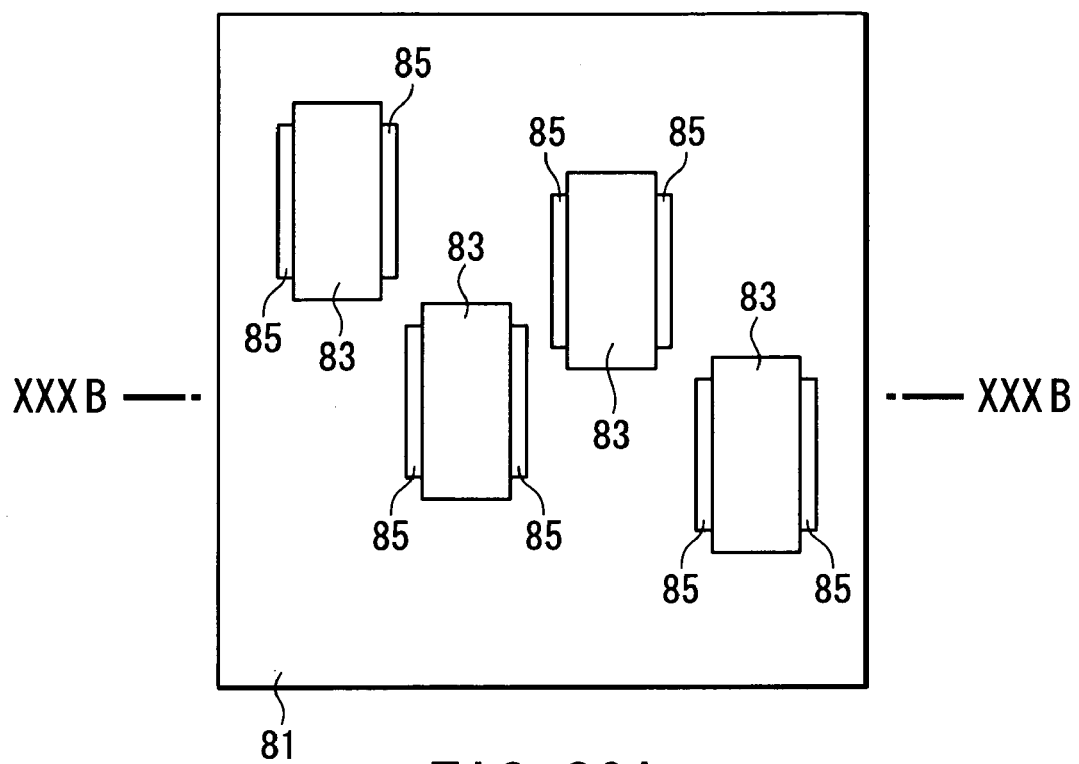
FIGS. 30A and 30B are diagrams to help explaining another method of forming Projections according to the fourth embodiment.
Figure 30B:
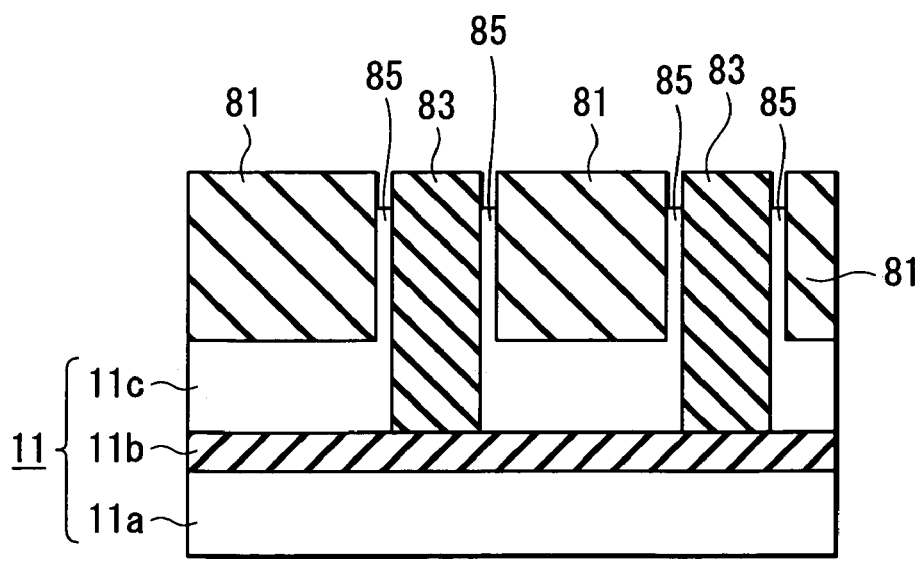
Figure 31A:
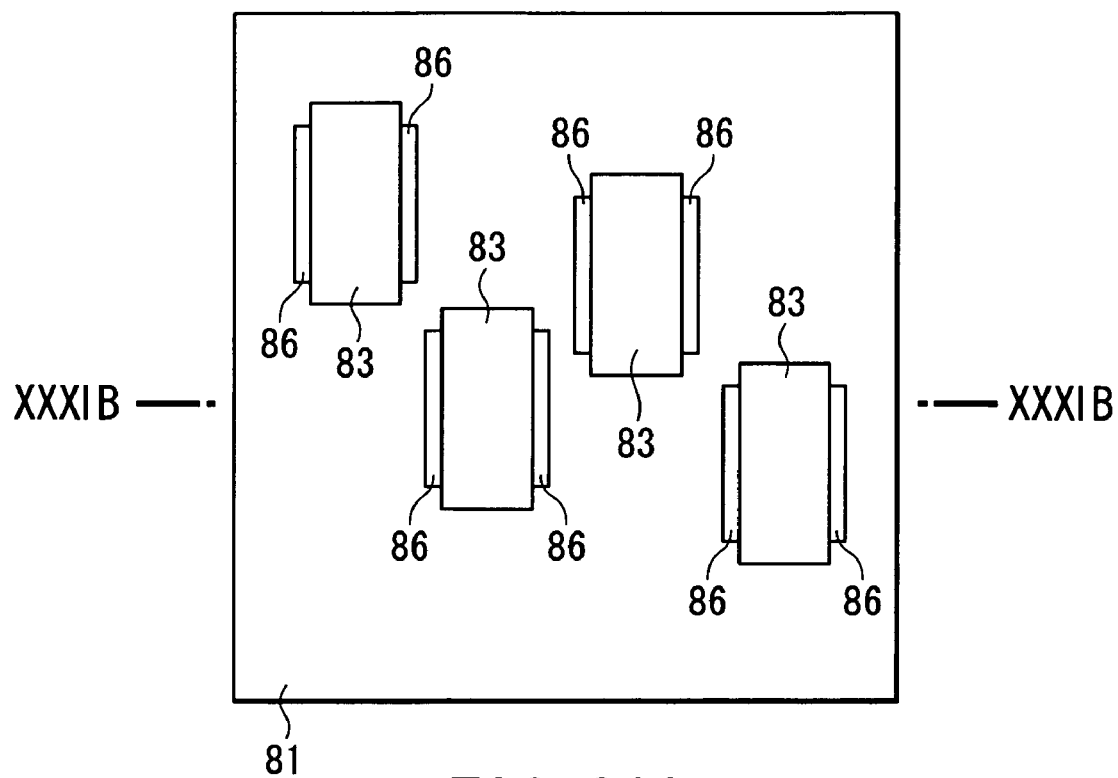
FIGS. 31A and 31B are diagrams to help explaining another method of forming Projections according to the fourth embodiment.
Figure 31B:
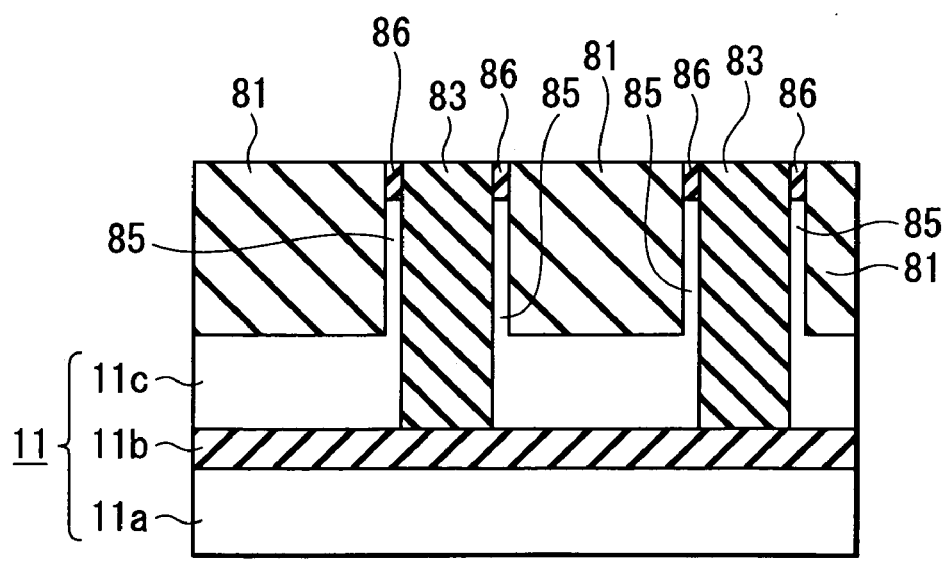
Figure 32A:
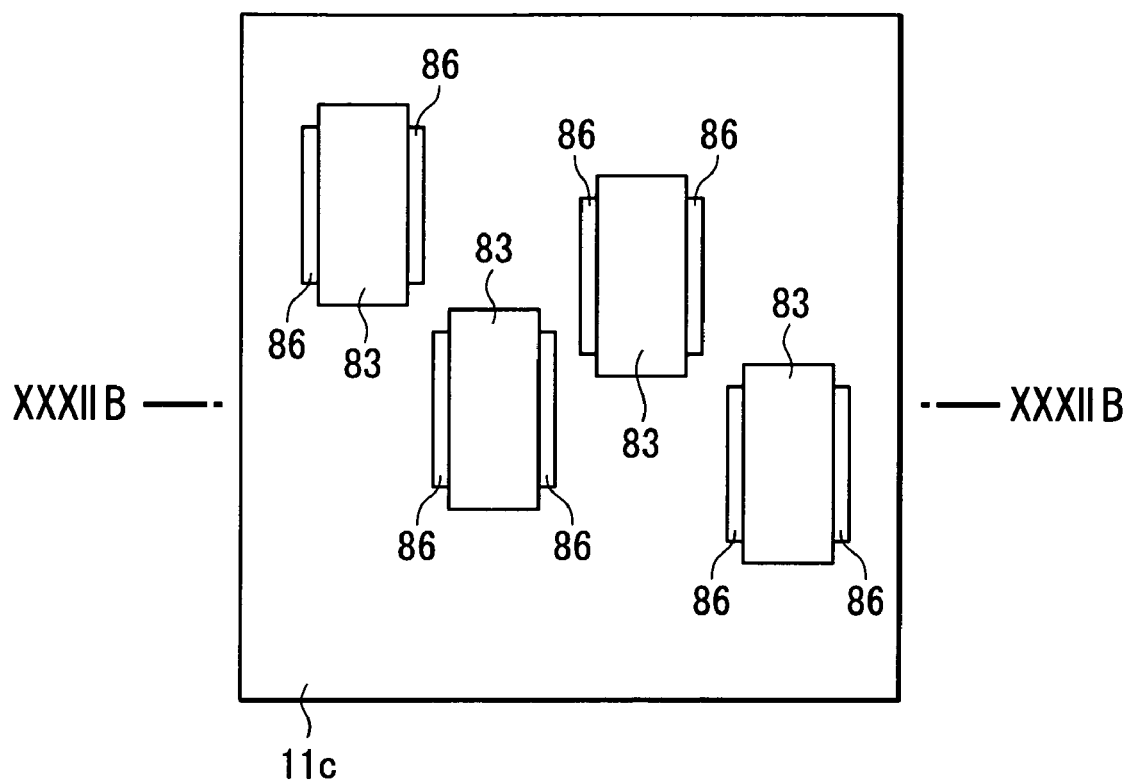
FIGS. 32A and 32B are diagrams to help explaining another method of forming Projections according to the fourth embodiment.
Figure 32B:
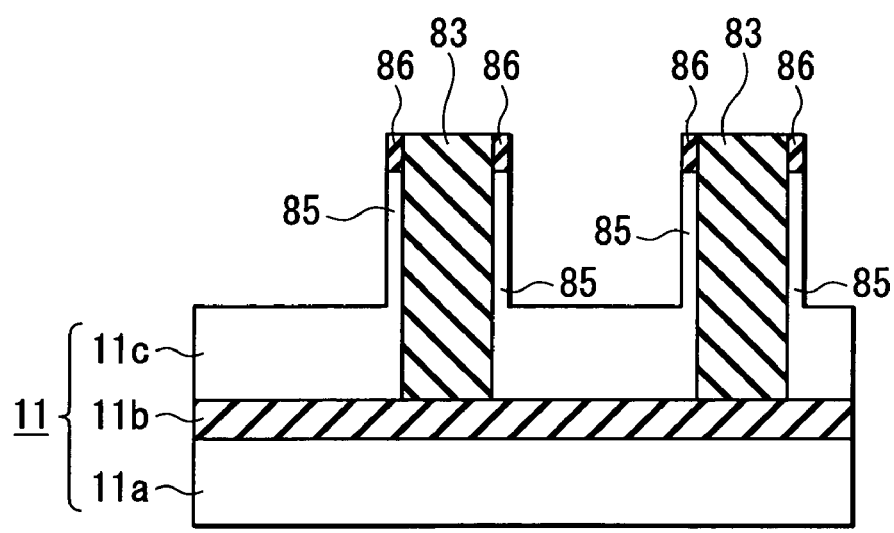

Next, for example, as shown in FIGS. 26A and 26B, a sixth insulating film, such as an SiN film 75, is deposited to isolate the Si-fins 74a, 74b facing each other. Then, the surface of the SiN film 75 is planarized. Then, for example, as shown in FIGS. 27A and 27B, the entire surface of the SiN film 75 is etched back, thereby leaving the SiN film 75 only on the p-well 71 and the n-well 72. At this point, the remaining thickness of the SiN film 75 is sufficiently thinner than the height of the Si-fins 74a, 74b in the vertical direction. As a result, isolations are formed among the Si-fin 74b of the Projection 70A and the Si-fin 74a of the Projection 70B, among the Si-fin 74b of the Projection 70B and the Si-fin 74a of the Projection 70C, and among the Si-fin 74b of the Projection 70C and the Si-fin 74a of the Projection 70D.

Thereafter, gate electrodes are formed by the aforementioned method, thereby completing Projections 70A, 70B, 70C, 70D. Each of the projections 70A to 70D has source and drain regions formed on both sides of the gate region. The gate region is formed in that portion of each of the Si-fins 74a and 74b which corresponds to the gate electrode. As described above, the Projections 70A, 70B, 70C, 70D can be formed on the bulk substrate 70, each having Si-fins 74a, 74b thinner than the gate length formed on a pair of side surfaces of the insulating film 73. This makes it possible to reduce the cost more than when the aforementioned SOI substrate is used.

Fourth Embodiment

FIGS. 28A and 28B to FIGS. 33A and 33B show another configuration of a Projection according to a fourth embodiment of the present invention. Explanation will be given in a case where a Projection composed of the aforementioned two Si-fins and one insulating film is manufactured using epitaxial technique.

First, on an SOI substrate 11, a seventh insulating film, such as a BSG film 81, is deposited. Then, the BSG film 81 and the Si layer 11c under the film 81 are etched off until the BOX layer 11b by a lithography process and an RIE process, thereby forming openings 82. The openings 82 are filled in with an eighth insulating film, such as a TEOS film 83. Then, the surface is planarized. As a result, a first insulating film made of the TEOS film 83 is formed (see FIGS. 28A and 28B). Next, a predetermined spacing 84 is formed among the filled TEOS film 83 and the BSG film 81. The spacing 84 is formed by selectively etching the BSG film 81 at the boundary with the TEOS film 83 by a lithography process and an RIE process until the Si layer 11c (see FIGS. 29A and 29B). In the fourth embodiment, the spacing 84 is formed on a pair of side surfaces (a first side surface and a second side surface) of the TEOS film 83 facing each other.

Next, an epitaxial growth is performed to form Si-fins on the Si layer 11c exposed as a result of the formation of the spacing 84, then an epitaxial layer 85 acting as an Si-fin is formed in the spacing 84. The epitaxial layer 85 is formed, so as not to fill the spacing 84 completely (see FIGS. 30A and 30B). Next, a ninth insulating film (a second insulating film) serving as a cap, such as an SiN film 86, is embedded, followed by the etching back of the entire surface. As a result, the SiN film 86 is left only on the top of the epitaxial layer 85 in the spacing 84 (see FIGS. 31A and 31B). Next, all of the BSG film 81 previously deposited is removed by an RIE process or the like (see FIGS. 32A and 32B).

Figure 33A:
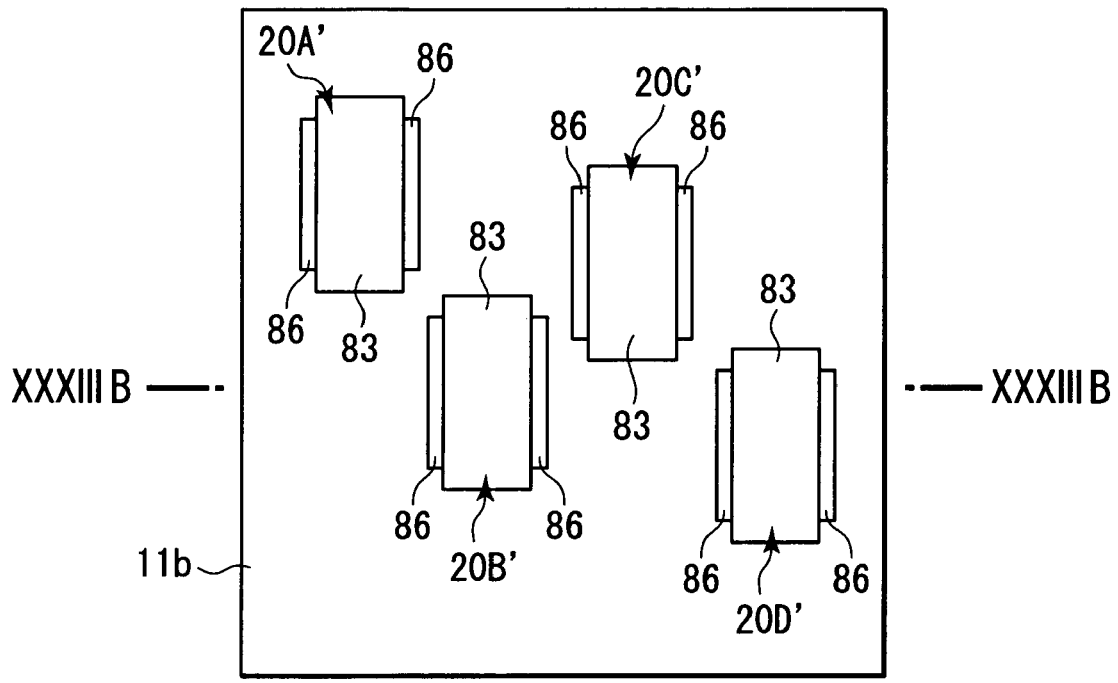
FIGS. 33A and 33B are diagrams to help explaining another method of forming Projections according to the fourth embodiment.
Figure 33B:
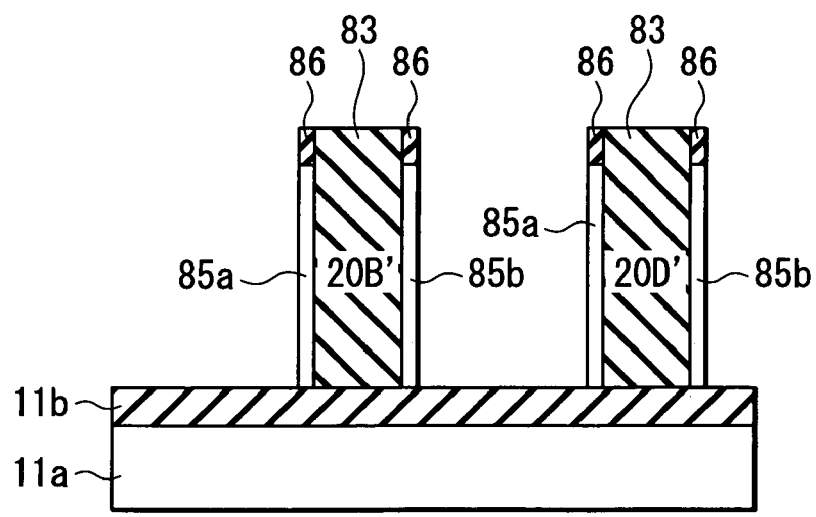

Next, the Si layer 11c exposed by removing the BSG film 81 is selectively etched by an RIE process or the like in such a manner that only the Si layer 11c is removed. As a result, a projecting part having an insulating film 83 provided among two Si-fins 85a, 85b is formed as shown in FIGS. 33A and 33B. Thereafter, gate electrodes are formed by the aforementioned method, thereby completing Projections 20A', 20B', 20C', 20D'. Each of the projections 20A' to 20D' has source and drain regions formed on both sides of the gate region. The gate region is formed in that portion of each of the Si-fins 85a and 85b which corresponds to the gate electrode.

The fourth embodiment also provides an equivalent effect to the first embodiment. Specifically, it is possible to form an Si-fin having thickness thinner than a critical dimension of lithography process for processing almost perpendicular to the SOI substrate, for example as thin as about several tens of angstroms. In this way, it is possible to form a MOS transistor whose short channel effect is suppressed and which has a full-depletion-type three-dimensional structure. With this configuration, since variance in the dimensions of the Si-fin can be reduced, a large number of Projections whose transistor characteristic are uniform can be manufactured.

Furthermore, in the configuration of the fourth embodiment, Si-fins whose width is thinner than the gate length are also formed on a pair of side surfaces of the insulating film with a film thickness of about several tens of nanometers. Therefore, even if the Si-fins are thin, they are resistant to lie down, which makes it easy to increase the height of the Si-fins. This is preferable for improving the current driving capability of the transistors.

Particularly, in the fourth embodiment, since Si-fins are formed by epitaxial growth, variance in a crystal orientation of a Si-fin serving as a channel is less than in a case where a Si-fin is formed through RIE process and the like as in the first and third embodiments. In addition, the roughness of the surface is also improved. As a result, the transistor characteristics can be improved compared to transistor characteristics in the first and third embodiments.

Fifth Embodiment

Figure 34:
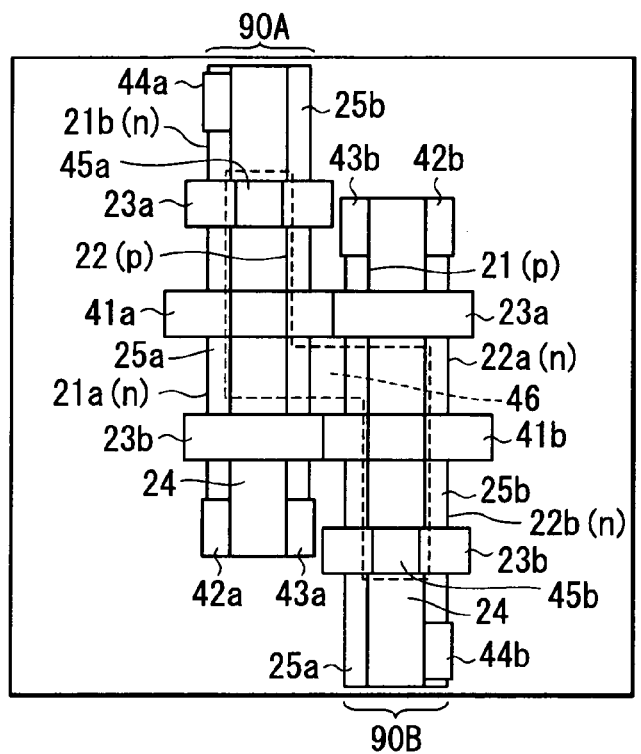
FIG. 34 is a plan view showing a configuration of an SRAM cell with a 6-transistor structure composed of two Projections each having three transistors according to a fifth embodiment of the present invention.

FIG. 34 shows another example of an SRAM cell composed of six transistors according to a fifth embodiment of the present invention. Explanation will be given about a case where one SRAM cell is configured using two Projections.

When one SRAM cell is configured using two Projections 90A, 90B each having three transistors, for example, each of the transistor 21a, 21b of the Projection 90A and the transistor 22a, 22b of the Projection 90B is an n-type MOS transistor. In addition, each of the transistor 22 of the Projection 90A and the transistor 21 of the Projection 90B is a p-type MOS transistor. Specifically, in the fifth embodiment, the Projection 90A has at least an n-type Si-fin 25a (transistor 21a, 21b) and a p-type Si-fin 25b (transistor 22). The Projection 90B has at least a p-type Si-fin 25a (transistor 21) and an n-type Si-fin 25b (transistor 22a, 22b).

The n-type Si-fin 25a and p-type Si-fin 25b of the Projection 90A are connected by a metal wiring line 41a, a second wiring layer. In addition, a Vss contact 42a is connected to one end of the n-type Si-fin 25a. A bit line contact 44a is connected to the other end of the n-type Si-fin 25a. On the other hand, a Vdd contact 43a is connected to one end of the p-type Si-fin 25b. In this way, a first inverter circuit composed of the three transistor 21a, 21b, 22 of the Projection 90A and a first transfer transistor are configured. Similarly, the p-type Si-fin 25a and n-type Si-fin 25b of the Projection 90B are connected by a metal wiring line 41b, the second wiring layer. In addition, a Vss contact 42b is connected to one end of the n-type Si-fin 25b. A bit line contact 44b is connected to the other end of the n-type Si-fin 25b. On the other hand, a Vdd contact 43b is connected to one end of the p-type Si-fin 25a. In this way, a second inverter circuit composed of the three transistor 21, 22a, 22b of the Projection 90B and a second transfer transistor are configured.

In each of the Projections 90A and 90B, two gate electrodes 23a, 23b are provided so as to interpose from above a projecting part composed of the Si-fins 25a, 25b and an insulating film 24. That is, the two gate electrodes 23a, 23b are provided so as to share the single projecting part. The metal wiring line 41a is connected to one gate electrode of the Projection 90B, for example, the gate electrode 23a. The metal wiring line 41b is connected to one gate electrode of the Projection 90A, for example, the gate electrode 23b. A word line contact 45a is connected to the gate electrode 23a of the Projection 90A. A word line contact 45b is connected to the gate electrode 23b of the Projection 90B. The gate electrode 23a of the Projection 90A and the gate electrode 23b of the Projection 90B are connected to each other by an upper-layer wiring line 46. In this way, an SRAM cell composed of the two Projections 90A, 90B is configured.

As described above, a 6-transistor-structure SRAM cell including a single latch circuit and two transfer transistors can be manufactured from two Projections 90A, 90B. Specifically, two projecting parts, each composed of the Si-fins 25a, 25b and insulating film 24, are arranged in a line, thereby configuring two Projections 90A, 90B. By doing this, it is possible to arrange efficiently six transistors necessary to configure an SRAM cell. Consequently, it is possible to reduce the cell area further as compared with the SRAM cell with the configuration described in the second embodiment.

Figure 35:
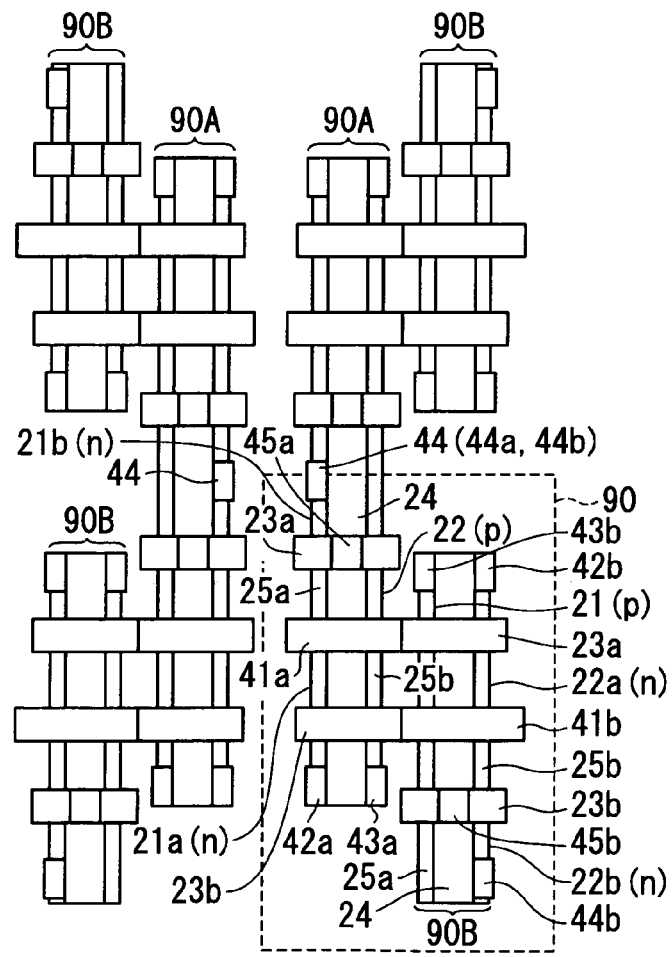
FIG. 35 is a plan view showing an example of the integration of SRAM cells as shown in FIG. 34.

FIG. 35 shows a case where a plurality of SRAM cells 90 are integrated, each cell composed of the two Projections 90A, 90B. In this case, for example, as shown in FIG. 35, two SRAM cells 90, 90 are configured and arranged so that they may share a single bit line contact 44 in the up-and-down direction. That is, the two SRAN cells 90, 90 are arranged in such a manner that they can share a bit line contact 44a for one SRAM cell 90 and a bit line contact 44b for the other SRAM cell 90. With this configuration, the cell area can be reduced even more.

For convenience's sake, the insulating layer buried among a plurality of SRAM cells 90 (Projections 90A, 90B), and the upper-layer wiring line for connecting the gate electrodes 23a, 23b to each other are omitted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a plurality of insulating films provided on a surface of the semiconductor substrate so as to be perpendicular to the surface;
   a first and second semiconductor films each having a thickness thinner than a gate length and provided on a first and second side surface of each of said plurality of insulating films;
   a plurality of gate electrodes each provided so as to interpose the corresponding first and second semiconductor films and the corresponding insulating films in between from upper side;
   a first wiring which selectively connects the plurality of gate electrodes with one another;
   a second wiring which selectively connects the plurality of gate electrodes with the first and second semiconductor films and the first and second semiconductor films with one another; and
   a plurality of wiring contacts which are selectively connected to the plurality of gate electrodes and the first and second semiconductor films;
   wherein a 6-transistor-structure SRAM (Static Random Access Memory) cell is configured in such a manner that,
   said plurality of insulating films include at least a first, second, third, and fourth insulating films, and
   the first wiring connects a first and fourth gate electrodes provided on the corresponding first and fourth insulating films with each other,
   the second wiring connects a second gate electrode provided on the second insulating film and the first semiconductor film provided on a first side surface of the fourth insulating film with each other and a first and second semiconductor film provided on a first and second side surface of the third insulating film with each other, and
   the plurality of wiring contacts are connected to the first and fourth gate electrodes provided on the first and fourth insulating films, the second semi-conductor film provided on the second side surface of the first insulating film, the first and second semiconductor films provided on the first and second side surfaces of the second insulating film, the first and second semiconductor films provided on the first and second side surfaces of the third insulating film, and the first semiconductor film provided on the first side surface of the fourth insulating film.

2. The semiconductor device according to claim 1, wherein the second semiconductor film provided on the second side surface of the first insulating film is of the n-type, the first semi-conductor film provided on the first side surface of the second insulating film is of the n-type, the second semiconductor film provided on the second side surface of the second insulating film is of the p-type, the first semiconductor film provided on the first side surface of the third insulating film is of the p-type, the second semiconductor film provided on the second side surface of the third insulating film is of the n-type, and the first semiconductor film provided on the first side surface of the fourth insulating film is of the n-type.

3. The semiconductor device according to claim 1 wherein, of the plurality of wiring contacts, the wiring contacts connected to the first and fourth gate electrodes are word line contacts, the wiring contacts connected to the second semiconductor film provided on the first insulating film and the first semiconductor film provided on the fourth insulating film are bit line contacts, die wiring contacts connected to the first semiconductor film provided on the second insulating film and the second semiconductor film provided on the third insulating film are Vdd contacts, and the wiring contacts connected to the second semiconductor film provided on the second insulating film and the first semiconductor film provided on the third insulating film are Vss contacts.

4. The semiconductor device according to claim 3, wherein the word line contacts are brought into contact with the first and fourth gate electrodes on the tops of the first and fourth insulating films each including the first and second semiconductor films, and the bit line contacts, the Vdd contacts, and the Vss contacts are brought into contact with the surfaces of the first and second semiconductor films in the horizontal direction and the vertical direction.

5. The semiconductor device according to claim 1, wherein, of the plurality of insulating films, she first and fourth insulating films are provided with two or more gate electrodes and a plurality of 6-transistor-structure SRAM cells are integrated.

6. The semiconductor device according to claim 1, wherein the semiconductor substrate is one of an SOI (Silicon on Insulator) substrate and a silicon substrate.

7. The semiconductor device according to claim 6, wherein well regions are selectively provided in the surface of the silicon substrate.

8. The semiconductor device according to claim 7, wherein isolation insulating films are selectively provided on the surface of the well regions.

9. The semiconductor device according to claim 8, wherein the isolation insulating films are formed shorter than a height of the first and second semiconductor films in the vertical direction.

10. The semiconductor device according to claim 1, wherein the first and second side surfaces of each of the plurality of insulating films are rectangular in shapes, the first and second semiconductor films are of an n-type or a p-type and current flows in a direction parallel to the surface of the semiconductor substrate, and the plurality of gate electrodes arc each, provided so as to be common to the first and second semiconductor films.

11. The semiconductor device according to claim 1, wherein a sidewall insulating film composed of insulating films of two types having different etching rates is provided on the periphery of each of the plurality of gate electrodes.

* * * * *